United States Patent
Kotani et al.

(10) Patent No.: US 7,646,065 B2
(45) Date of Patent: Jan. 12, 2010

(54) SEMICONDUCTOR DEVICE INCLUDING FULLY-SILICIDED (FUSI) GATE ELECTRODES

(75) Inventors: Naoki Kotani, Hyogo (JP); Gen Okazaki, Hyogo (JP); Shinji Takeoka, Osaka (JP); Junji Hirase, Osaka (JP); Akio Sebe, Osaka (JP); Kazuhiko Aida, Chiba (JP)

(73) Assignee: Panasonic Corporation, Osaka (JP)

( * ) Notice: Subject to any disclaimer, the term of this patent is extended or adjusted under 35 U.S.C. 154(b) by 230 days.

(21) Appl. No.: 11/542,269

(22) Filed: Oct. 4, 2006

(65) Prior Publication Data

US 2007/0080405 A1 Apr. 12, 2007

(30) Foreign Application Priority Data

Oct. 6, 2005 (JP) ............................... 2005-293268

(51) Int. Cl.
*H01L 29/786* (2006.01)
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ............... 257/366; 257/369; 257/E21.422; 257/413

(58) Field of Classification Search .................. 257/369, 257/366, E21.422

See application file for complete search history.

(56) References Cited

U.S. PATENT DOCUMENTS

| | | | | |
|---|---|---|---|---|
| 5,847,411 A | * | 12/1998 | Morii | ........................... 257/64 |
| 6,426,532 B1 | * | 7/2002 | Iwata et al. | .................. 257/374 |
| 7,109,516 B2 | * | 9/2006 | Langdo et al. | ................. 257/19 |
| 2002/0020860 A1 | * | 2/2002 | Arai | ........................... 257/260 |
| 2006/0163662 A1 | * | 7/2006 | Kinoshita et al. | ........... 257/369 |

OTHER PUBLICATIONS

Webster's II New Riverside University Dictionary, 1984, p. 67.*
T. Aoyama, et al., "Proposal of New HfSiON CMOS Fabrication Process (HAMDAMA) for Low Standby Power Device," International Electron Device Meeting, 2004, IEEE.

* cited by examiner

*Primary Examiner*—Howard Weiss
*Assistant Examiner*—Tifney L Skyles
(74) *Attorney, Agent, or Firm*—McDermott Will & Emery LLP

(57) ABSTRACT

A semiconductor device includes: an isolation region formed in a semiconductor substrate; an active region surrounded by the isolation region in the semiconductor substrate; a gate insulating film formed on the active region; and a gate electrode formed across the boundary between the active region and the isolation region adjacent to the active region. The gate electrode includes a first portion which is located above the active region with the gate insulating film interposed therebetween and is entirely made of a silicide in a thickness direction and a second portion which is located above the isolation region and is made of a silicon region and the silicide region covering the silicon region.

13 Claims, 16 Drawing Sheets

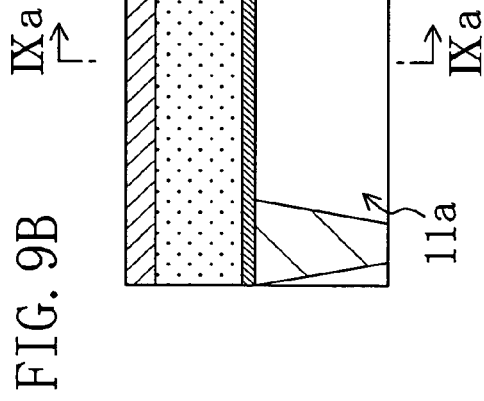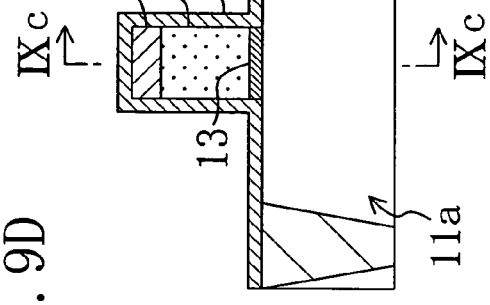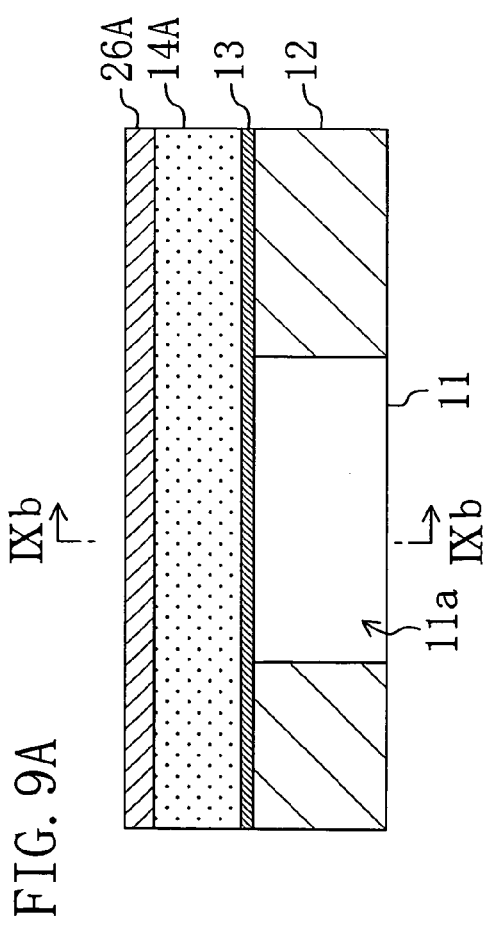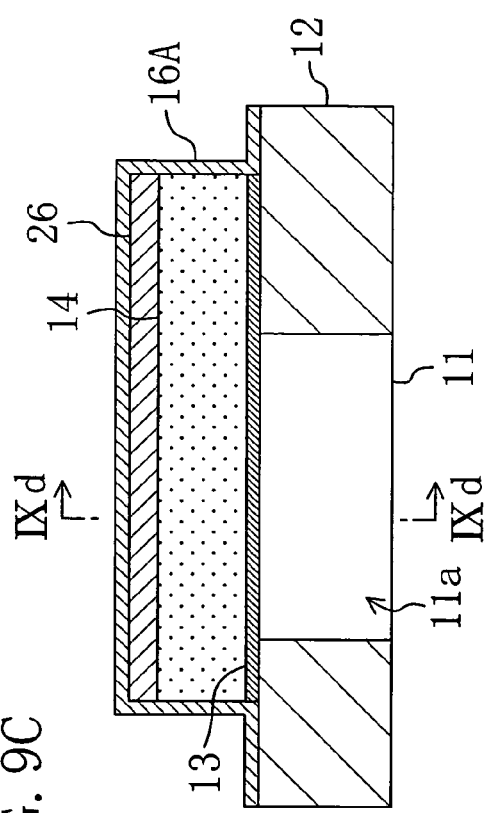

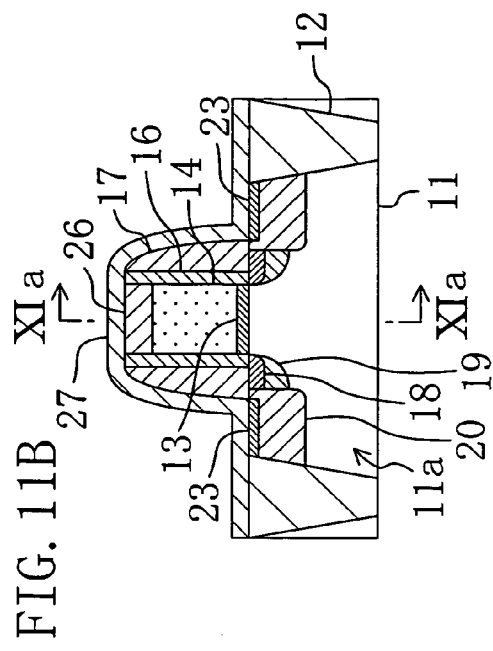
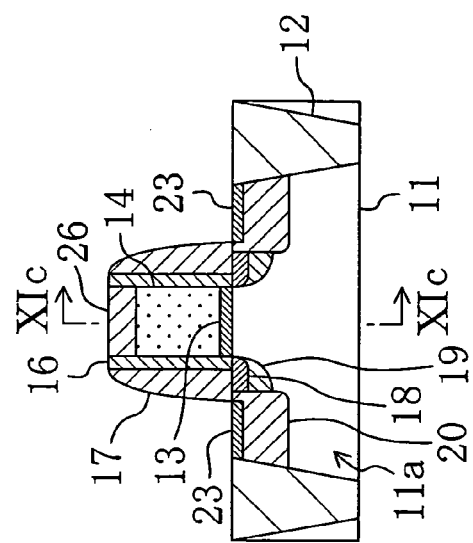
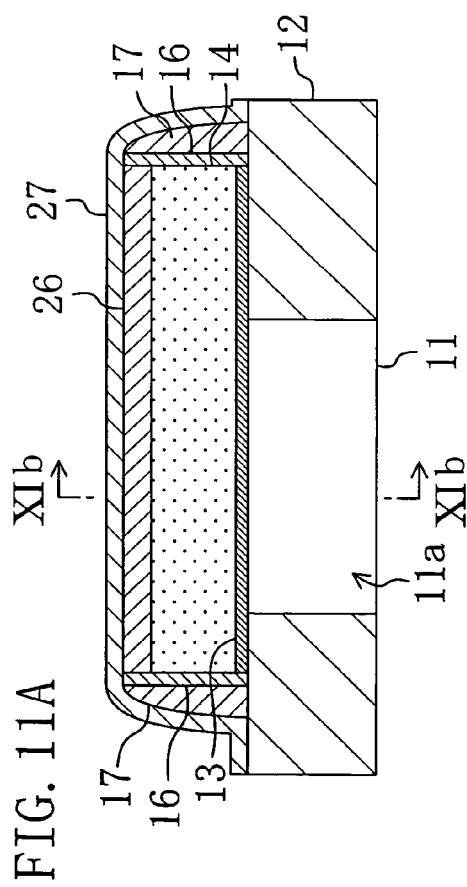
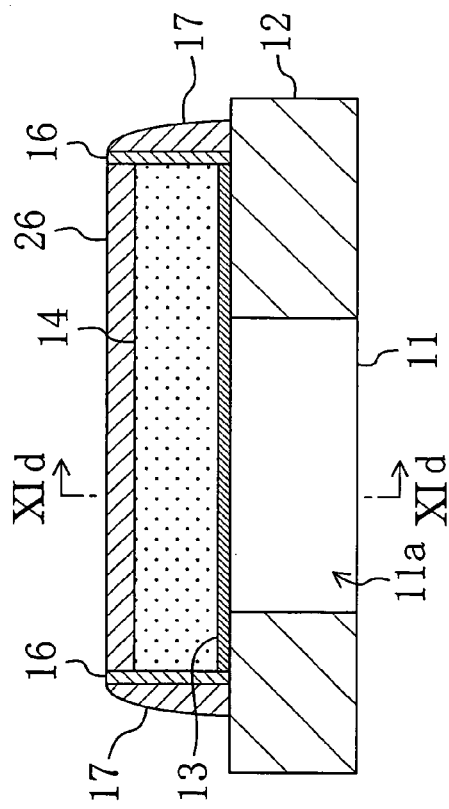

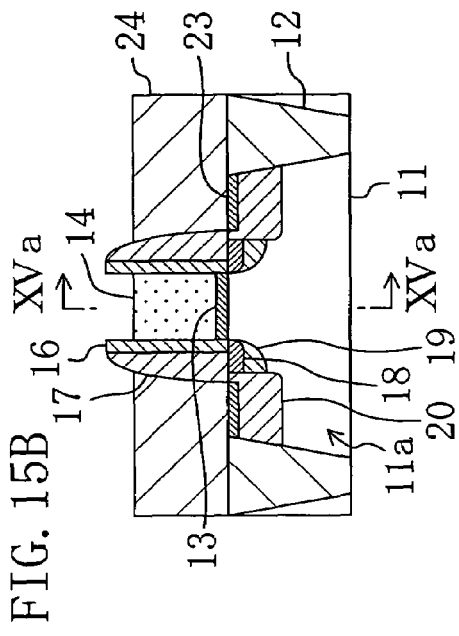
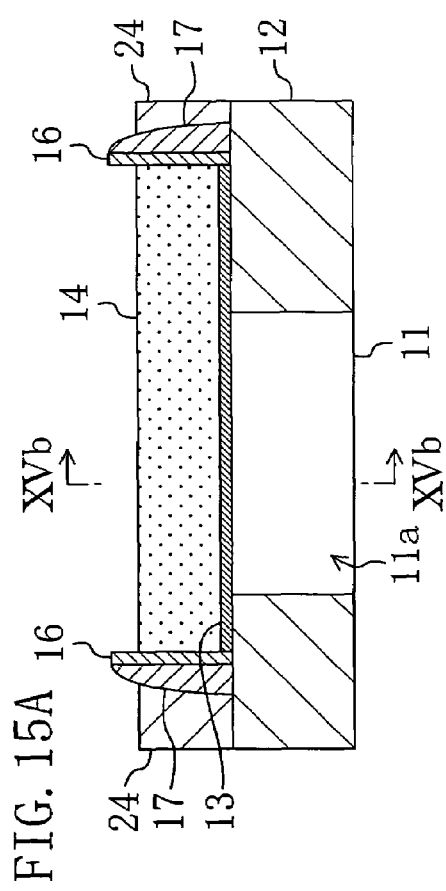
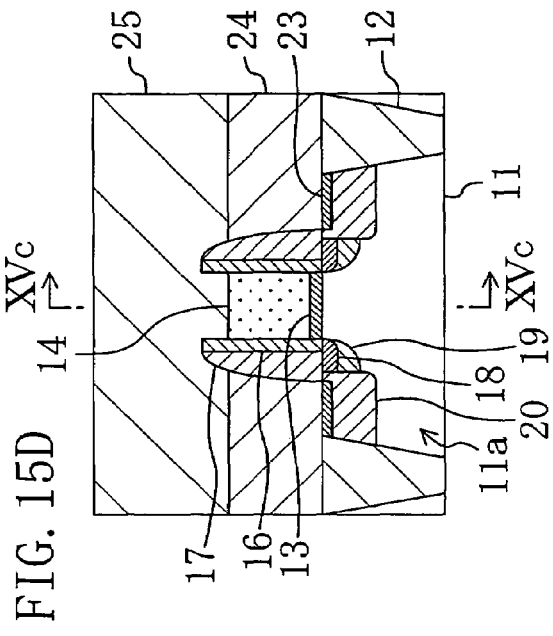
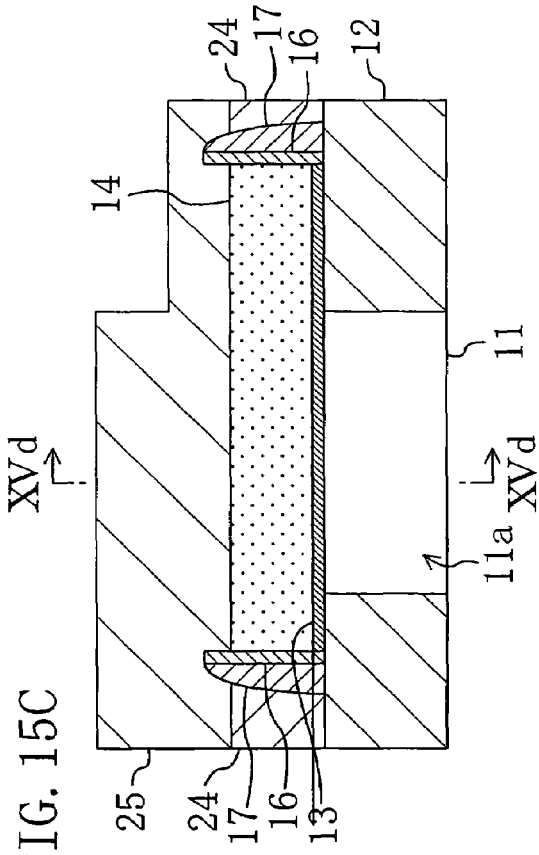

SEMICONDUCTOR DEVICE INCLUDING FULLY-SILICIDED (FUSI) GATE ELECTRODES

CROSS-REFERENCE TO RELATED APPLICATION

The disclosure of Japanese Patent Applications No. 2005-293268 filed in Japan on Oct. 6, 2005 and No. 2006-175777 filed in Japan on Jun. 26, 2006 including specification, drawings and claims is incorporated herein by reference in its entirety.

BACKGROUND OF THE INVENTION

The present invention relates to semiconductor devices and methods for fabricating the devices, and particularly relates to semiconductor devices including fully-silicided (FUSI) gate electrodes and methods for fabricating the devices.

In the field of semiconductor devices, increase of speed and reduction of power consumption are accelerated because of rapid miniaturization of elements in recent years. Accordingly, enhancement of transistor performance is urgently needed. However, conventional miniaturization of elements alone is now insufficient for enhancement of transistor performance.

In view of this, in a metal insulator semiconductor (MIS) transistor, a film having a high dielectric constant (i.e., a high-κ film) is used as a gate insulating film and a gate electrode is fully made of a metal so that reduction of gate leakage current and enhancement of transistor driving ability are both achieved.

FIGS. 16A and 16B illustrate a full silicidation process in a method for fabricating a conventional MIS transistor. FIG. 16A is a cross-sectional view in the gate width direction and FIG. 16B is a cross-sectional view in the gate length direction (see, for example, International Electron Device Meeting p. 95, 2004). As illustrated in FIGS. 16A and 16B, first, an isolation region 102 is selectively formed in a semiconductor substrate 101, thereby forming an active region 101a. Then, a gate insulating film 103 and a gate electrode film 104 made of polysilicon are deposited. Thereafter, the gate electrode film 104 is patterned such that the ends of the gate electrode film 104 in the gate width direction are located inside the isolation region 102 when viewed from above. Subsequently, an offset sidewall 105 is formed on the side of the gate electrode film 104. Using the offset sidewall 105 and the gate electrode film 104 as a mask, an extension region 106 and a pocket region 107 having a conductivity different from that of the extension region 106 are sequentially formed below the side of the offset sidewall 105 in the active region 101a. Thereafter, a sidewall 108 is formed at the side of the gate electrode film 104 with the offset sidewall 105 interposed therebetween. Using the sidewall 108, the offset sidewall 105 and the gate electrode film 104 as a mask, a source/drain region 109 is formed below the side of the sidewall 108 in the active region 101a. Then, only an upper portion of the source/drain region 109 is selectively silicided, thereby forming a silicide layer 110. Subsequently, an interlayer insulating film 111 is formed on the semiconductor substrate 101 and then is planarized by chemical mechanical polishing (CMP) until the gate electrode film 104 is exposed. Thereafter, an upper portion of the gate electrode film 104 is selectively removed by etching. Then, a nickel film 112 is deposited by sputtering over the interlayer insulating film 111 and the gate electrode film 104 having a reduced thickness. Subsequently, the nickel film 112 is subjected to heat treatment so that reaction occurs between polysilicon forming the gate electrode film 104 and nickel, thereby forming a gate electrode (FUSI gate electrode) in which the entire gate electrode film 104 is silicided.

However, in the method for fabricating a conventional semiconductor device, full silicidation, i.e., silicidation of the entire gate electrode, causes a problem in which the capacitance of the gate electrode increases.

SUMMARY OF THE INVENTION

It is therefore an object of the present invention to reduce the capacitance of a fully-silicided gate electrode.

To achieve the object, according to the present invention, a semiconductor device has a configuration in which silicon is left on purpose in an end (e.g., a contact region) of a gate electrode located above an isolation region, whereas the gate electrode is fully silicided above an active region.

Specifically, a semiconductor device according to the present invention is characterized by including: an isolation region formed in a semiconductor substrate; an active region surrounded by the isolation region in the semiconductor substrate; a gate insulating film formed on the active region; and a gate electrode formed across the boundary between the active region and the isolation region adjacent to the active region, wherein the gate electrode includes a first portion which is located above the active region with the gate insulating film interposed therebetween and is entirely made of a silicide region in a thickness direction and a second portion which is located above the isolation region and is made of a silicon region and the silicide region covering the silicon region.

In the semiconductor device of the present invention, depletion occurs in the silicon region remaining in the second portion, so that the gate electrode capacitance is reduced, as compared to the case of siliciding the entire gate electrode.

In the semiconductor device of the present invention, it is preferable that the silicon region is located above the isolation region and is apart from the boundary between the active region and the isolation region.

In the semiconductor device of the present invention, the silicon region is preferably formed across a portion above the active region.

In the semiconductor device of the present invention, the length in a gate length direction of the second portion of the gate electrode is preferably larger than that of the first portion of the gate electrode.

In the semiconductor device of the present invention, the length in a gate length direction of the first portion of the gate electrode is preferably equal to that of the second portion of the gate electrode.

In the semiconductor device of the present invention, the second portion of the gate electrode is preferably a contact region.

In the semiconductor device of the present invention, the silicon region is preferably made of one of polysilicon and amorphous silicon.

In the semiconductor device of the present invention, the silicide region is preferably made of nickel silicide.

In the semiconductor device of the present invention, the gate insulating film is preferably made of a high-dielectric-constant film.

A method for fabricating a semiconductor device according to the present invention is characterized by including the steps of: (a) forming an isolation region in a semiconductor substrate, thereby forming an active region surrounded by the isolation region; (b) forming a gate insulating film on the active region; (c) forming a gate electrode film made of silicon across the boundary between the active region and the isolation region adjacent to the active region, after the step (b); (d) forming a metal film on the gate electrode film; and (e) performing heat treatment on the semiconductor substrate, thereby siliciding the gate electrode film with the metal film and forming a gate electrode, wherein in the step (e), the entire region in a thickness direction of a first portion of the gate electrode film located above the active region is silicided, whereas a second portion of the gate electrode film located above the isolation region is silicided with a silicon region left in a portion of the second portion.

With the method for fabricating a semiconductor device according to the present invention, the gate electrode is silicided with metal with a silicon region being left in a portion of an end of the gate electrode, so that depletion occurs in the silicon region. Accordingly, the gate electrode capacitance is reduced, as compared to the case of siliciding the entire gate electrode.

In the method of the present invention, in the step (c), the gate electrode film is preferably formed such that the length in a gate length direction of the second portion of the gate electrode film is larger than that of the first portion of the gate electrode film.

In the method of the present invention, in the step (c), the gate electrode film is preferably formed such that the length in a gate length direction of the first portion of the gate electrode film is equal to that of the second portion of the gate electrode film.

The method of the present invention preferably further includes the step (f) of removing an upper portion of the first portion of the gate electrode film, after the step (c) and before the step (d).

The method of the present invention preferably further includes the step (g) of removing an upper portion of the metal film located on the second portion of the gate electrode film, after the step (d) and before the step (e).

The method of the present invention preferably further includes, after the step (c) and before the step (d), the steps of: (h) forming a first sidewall made of a first insulating film on a side face of the gate electrode film; and (i) implanting impurity ions in the active region using the gate electrode film and the first sidewall as a mask after the step (h), thereby forming an extension region in the active region.

The method of the present invention preferably further includes, after the step (i) and before the step (d), the steps of: (j) forming a second sidewall made of a second insulating film at the side face of the gate electrode film with the first sidewall interposed therebetween; and (k) implanting impurity ions in the active region using the gate electrode film, the first sidewall and the second sidewall as a mask after the step (j), thereby forming a source/drain region in the active region.

The method of the present invention preferably further includes, after the step (k) and before the step (d), the step (i) of forming a silicide layer on the source/drain region.

BRIEF DESCRIPTION OF THE DRAWINGS

FIG. 1A is a plan view and FIG. 1B is a cross-sectional view taken along the line Ib-Ib in FIG. 1A.

FIG. 2A is a cross-sectional view taken along the line IIa-IIa in FIG. 2B, FIG. 2B is a cross-sectional view taken along the line IIb-IIb in FIG. 2A, FIG. 2C is a cross-sectional view taken along the line IIc-IIc in FIG. 2D, and FIG. 2D is a cross-sectional view taken along the line IId-IId in FIG. 2C.

FIG. 3A is a cross-sectional view taken along the line IIIa-IIIa in FIG. 3B, FIG. 3B is a cross-sectional view taken along the line IIIb-IIIb in FIG. 3A, FIG. 3C is a cross-sectional view taken along the line IIIc-IIIc in FIG. 3D, and FIG. 3D is a cross-sectional view taken along the line IIId-IIId in FIG. 3C.

FIG. 4A is a cross-sectional view taken along the line IVa-IVa in FIG. 4B, FIG. 4B is a cross-sectional view taken along the line IVb-IVb in FIG. 4A, FIG. 4C is a cross-sectional view taken along the line IVc-IVc in FIG. 4D, and FIG. 4D is a cross-sectional view taken along the line IVd-IVd in FIG. 4C.

FIG. 5A is a cross-sectional view taken along the line Va-Va in FIG. 5B, FIG. 5B is a cross-sectional view taken along the line Vb-Vb in FIG. 5A, FIG. 5C is a cross-sectional view taken along the line Vc-Vc in FIG. 5D, and FIG. 5D is a cross-sectional view taken along the line Vd-Vd in FIG. 5C.

FIG. 6A is a cross-sectional view taken along the line VIa-VIa in FIG. 6B, FIG. 6B is a cross-sectional view taken along the line VIb-VIb in FIG. 6A, FIG. 6C is a cross-sectional view taken along the line VIc-VIc in FIG. 6D, and FIG. 6D is a cross-sectional view taken along the line VId-VId in FIG. 6C.

FIG. 7A is a cross-sectional view taken along the line VIIa-VIIa in FIG. 7B and FIG. 7B is a cross-sectional view taken along the line VIIb-VIIb in FIG. 7A.

FIG. 8A is a plan view and FIG. 8B is a cross-sectional view taken along the line VIIIb-VIIIb in FIG. 8A.

FIGS. 9A through 9D illustrate cross-sectional structures in respective process steps of a method for fabricating a semiconductor device according to the second embodiment in the order of fabrication. FIG. 9A is a cross-sectional view taken along the line IXa-IXa in FIG. 9B, FIG. 9B is a cross-sectional view taken along the line IXb-IXb in FIG. 9A, FIG. 9C is a cross-sectional view taken along the line IXc-IXc in FIG. 9D, and FIG. 9D is a cross-sectional view taken along the line IXd-IXd in FIG. 9C.

FIG. 10A is a cross-sectional view taken along the line Xa-Xa in FIG. 10B, FIG. 10B is a cross-sectional view taken along the line Xb-Xb in FIG. 10A, FIG. 10C is a cross-sectional view taken along the line Xc-Xc in FIG. 10D, and FIG. 10D is a cross-sectional view taken along the line Xd-Xd in FIG. 1C.

FIGS. 11A through 11D illustrate cross-sectional structures in respective process steps of the method for fabricating a semiconductor device according to the second embodiment in the order of fabrication. FIG. 11A is a cross-sectional view taken along the line XIa-XIa in FIG. 11B, FIG. 11B is a cross-sectional view taken along the line XIb-XIb in FIG. 11A, FIG. 11C is a cross-sectional view taken along the line XIc-XIc in FIG. 11D, and FIG. 11D is a cross-sectional view taken along the line XId-XId in FIG. 11C.

FIG. 12A is a cross-sectional view taken along the line XIIa-XIIa in FIG. 12B, FIG. 12B is a cross-sectional view taken along the line XIIb-XIIb in FIG. 12A, FIG. 12C is a cross-sectional view taken along the line XIIc-XIIc in FIG. 12D, and FIG. 12D is a cross-sectional view taken along the line XIId-XIId in FIG. 12C.

FIG. 13A is a cross-sectional view taken along the line XIIIa-XIIIa in FIG. 13B and FIG. 13B is a cross-sectional view taken along the line XIIIb-XIIIb in FIG. 13A.

FIG. 14A is a plan view and FIG. 14B is a cross-sectional view taken along the line XIVb-XIVb in FIG. 14A.

FIGS. 15A through 15D illustrate main portions of cross-sectional structures in respective process steps of a method for fabricating a semiconductor device according to a third embodiment of the present invention. FIG. 15A is a cross-sectional view taken along the line XVa-XVa in FIG. 15B, FIG. 15B is a cross-sectional view taken along the line XVb-XVb in FIG. 15A, FIG. 15C is a cross-sectional view taken along the line XVc-XVc in FIG. 15D, and FIG. 15D is a cross-sectional view taken along the line XVd-XVd in FIG. 15C.

FIG. 16A is a cross-sectional view in the gate width direction taken along the line XVIa-XVIa in FIG. 16A and FIG. 16B is a cross-sectional view in the gate length direction and taken along the line XVIb-XVIb in FIG. 16A.

DETAILED DESCRIPTION OF THE INVENTION

Embodiment 1

A first embodiment of the present invention will be described with reference to the drawings.

Figure 1A:
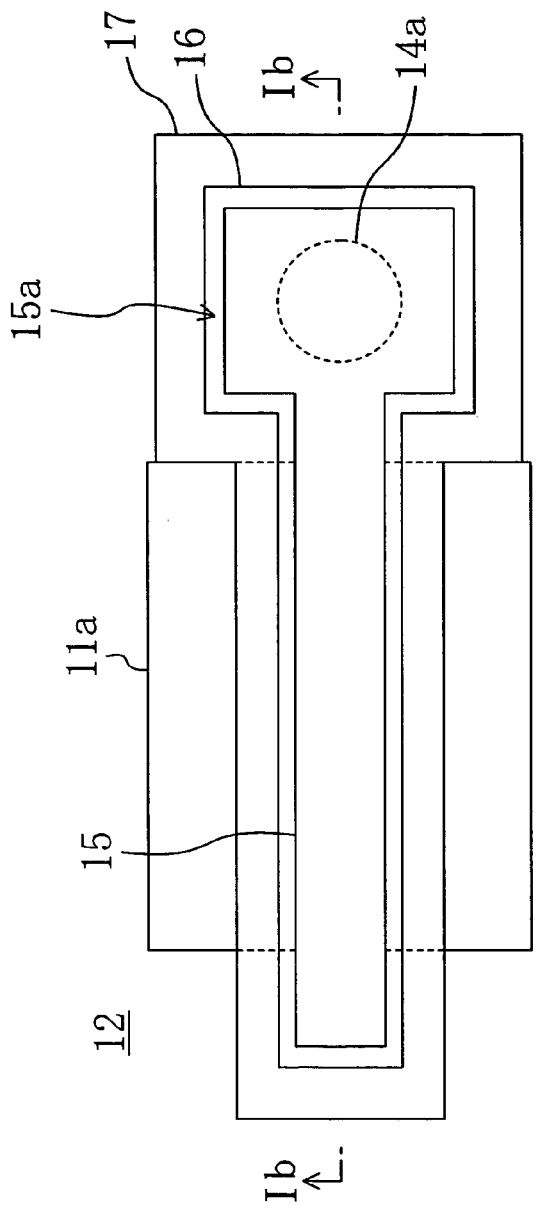
FIGS. 1A and 1B illustrate a semiconductor device according to a first embodiment of the present invention.
Figure 1B:
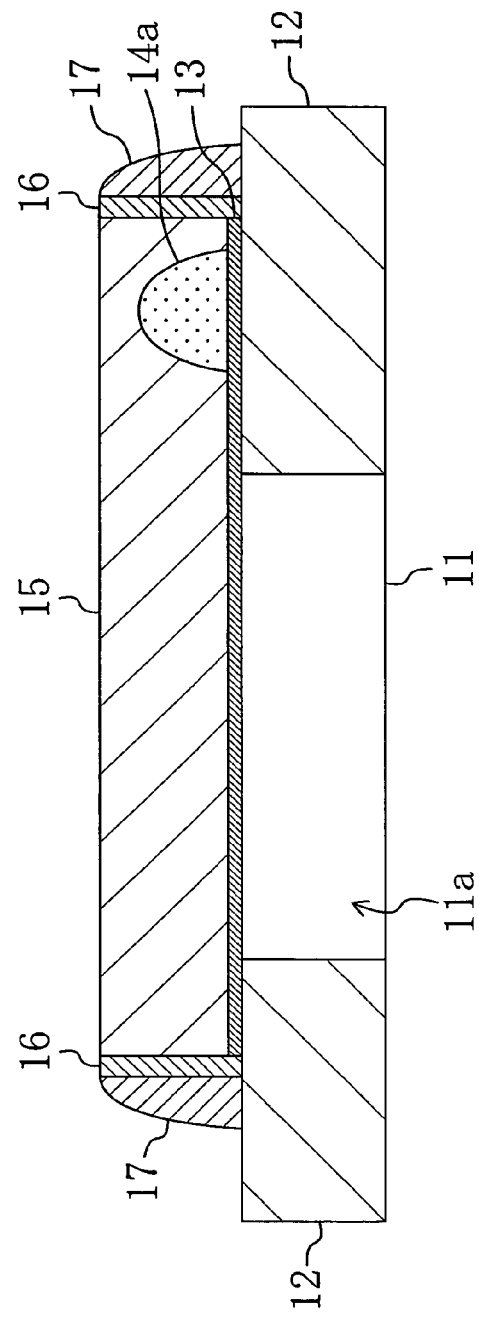

FIGS. 1A and 1B illustrate a semiconductor device according to the first embodiment. FIG. 1A is a plan view and FIG. 1B is a cross-sectional view taken along the line Ib-Ib in FIG. 1A. As illustrated in FIGS. 1A and 1B, an isolation region 12 of shallow trench isolation (STI) and an active region 11a surrounded by the isolation region 12 are formed in an upper portion of a semiconductor substrate 11 made of, for example, silicon (Si).

As illustrated in FIG. 1B, a silicided gate electrode 15 is formed over the principal surface of the semiconductor substrate 11 to cover the active region 11a and the isolation region 12 with a gate insulating film 13 of a high-κ film interposed therebetween. The high-κ film may be made of hafnium oxide ($HfO_2$), hafnium silicate (HfSiO) or HfSiON, for example.

An end of the gate electrode 15 located above the isolation region 12 is wider, in the gate length direction, than the other portion of the gate electrode 15 located above the active region 11a and serves as a contact region 15a, for example.

As illustrated in FIGS. 1A and 1B, an offset sidewall 16 made of silicon dioxide ($SiO_2$) and a sidewall 17 made of silicon nitride ($Si_3N_4$) are stacked in this order on the side of the gate electrode 15.

This embodiment is characterized in that the entire portion of the gate electrode 15 located above the active region 11a is silicided, i.e., has a FUSI (fully silicided) structure, and the contact region 15a is formed above the isolation region 12 with island polysilicon 14a left in the center thereof. In this manner, the island polysilicon 14a remains in one end of the gate electrode 15 located above the isolation region 12, whereas the portion of the gate electrode 15 located above the active region 11a is fully silicided. Accordingly, depletion occurs in the gate electrode 15, thus reducing the gate electrode capacitance.

Hereinafter, a method for fabricating a semiconductor device thus configured will be described with reference to the drawings.

FIGS. 2A through 2D to FIGS. 7A and 7B illustrate cross-sectional structures in respective process steps of a method for fabricating a semiconductor device according to the first embodiment in the order of fabrication. FIGS. 2A, 2C, 3A, 3C, 4A, 4C, 5A, 5C, 6A, 6C and 7A illustrate cross-sectional structures in the gate width direction. FIGS. 2B, 2D, 3B, 3D, 4B, 4D, 5B, 5D, 6B, 6D and 7B illustrate cross-sectional structures in the gate length direction.

Figure 2A:
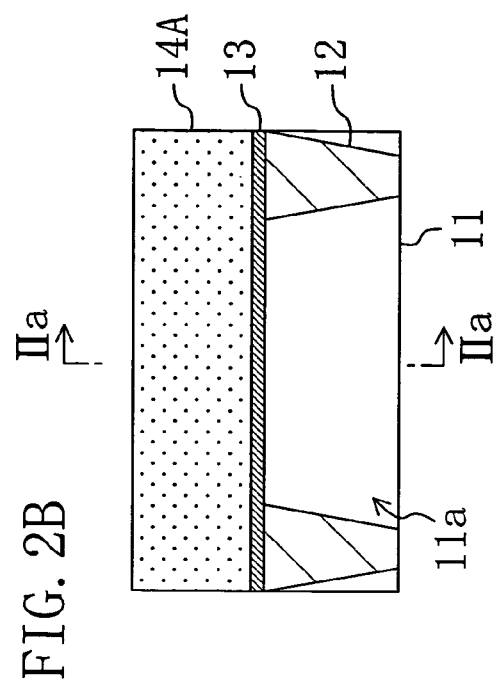
FIGS. 2A through 2D illustrate cross-sectional structures in respective process steps of a method for fabricating a semiconductor device according to the first embodiment in the order of fabrication.
Figure 2B:
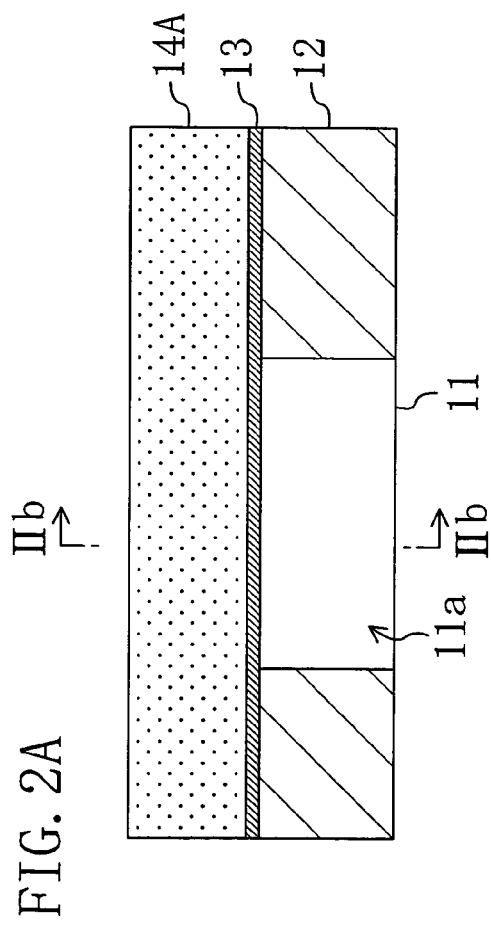

First, as illustrated in FIGS. 2A and 2B, an isolation region 12 of STI is selectively formed in an upper portion of a semiconductor substrate 11, thereby forming an active region 11a surrounded by the isolation region 12. Thereafter, a gate insulating film 13 of hafnium oxide with a thickness of 3 nm is formed on the entire principal surface of the semiconductor substrate by, for example, chemical vapor deposition (CVD). Subsequently, a semiconductor film 14A of polysilicon with a thickness of 100 nm is formed on the gate insulating film 13. The semiconductor film 14A may be made of amorphous silicon, instead of polysilicon.

Figure 2C:
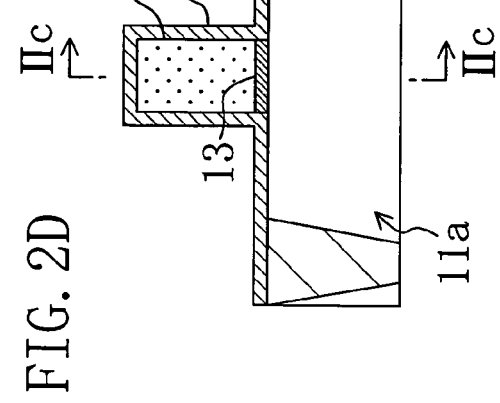
Figure 2D:
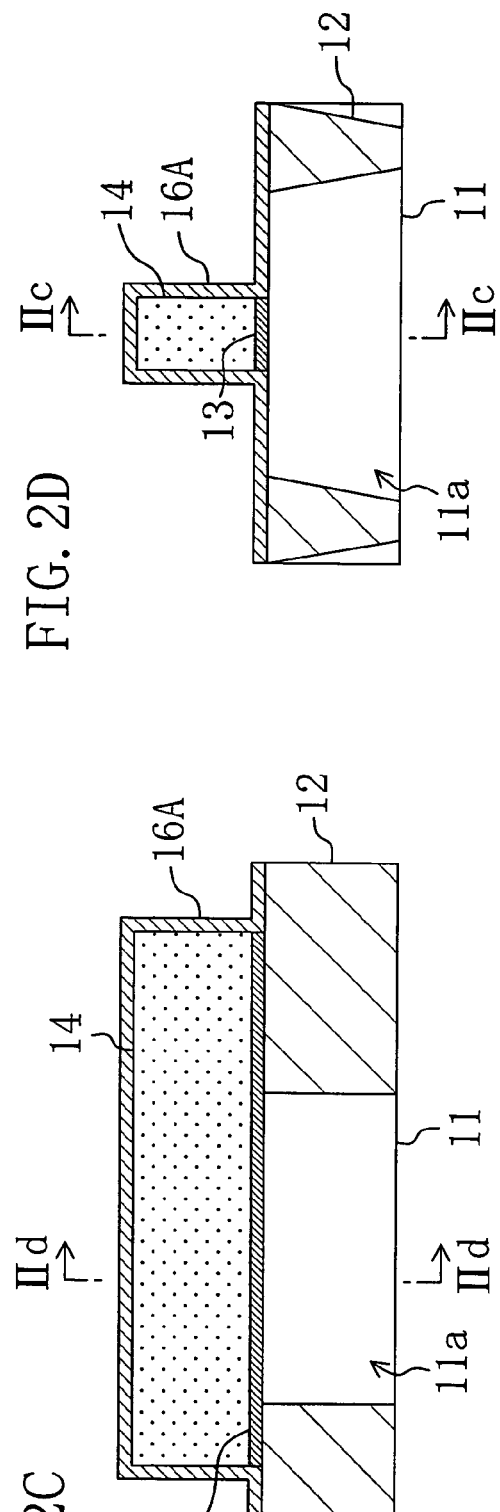

Next, as illustrated in FIGS. 2C and 2D, the semiconductor film 14A is patterned by lithography and dry etching using an etching gas containing chlorine ($Cl_2$) or hydrogen bromide (HBr) as a main component, thereby forming a gate electrode film 14. As illustrated in FIG. 1A, the gate electrode film 14 is patterned in such a manner that the middle of the gate electrode film 14 is located above the active region 11a, both ends thereof are located above the isolation region 12 and the width in the gate length direction of the gate electrode film 14 is large so that one of the ends of the gate electrode film 14 serves as a contact region. In this case, the width of the contact region of the gate electrode film 14 located above the isolation region 12 is preferably 1.5 times as large as the width of the gate electrode film 14 located above the active region 11a or more in the gate length direction. For example, if the width in the gate length direction of the gate electrode film 14 located above the active region 11a is about 65 nm, the width of the contact region of the gate electrode film 14 located above the isolation region 12 is set at about 120 nm in consideration of the diameter (e.g., 80 nm) of a contact to be formed and an alignment margin (e.g., 20 nm at each end). Subsequently, a TEOS (tetra-ethyl-ortho-silicate) film 16A with a thickness of 14 nm is formed over the entire surface of the semiconductor substrate 11 including the gate electrode film 14.

Figure 3A:
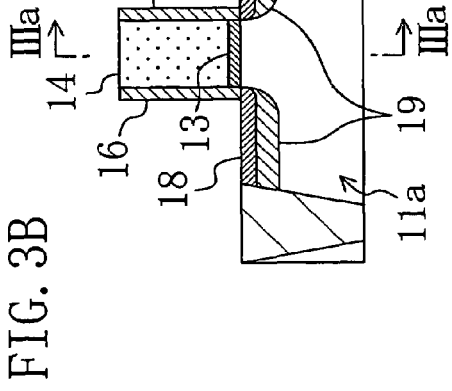
FIGS. 3A through 3D illustrate cross-sectional structures in respective process steps of the method for fabricating a semiconductor device according to the first embodiment in the order of fabrication.
Figure 3B:
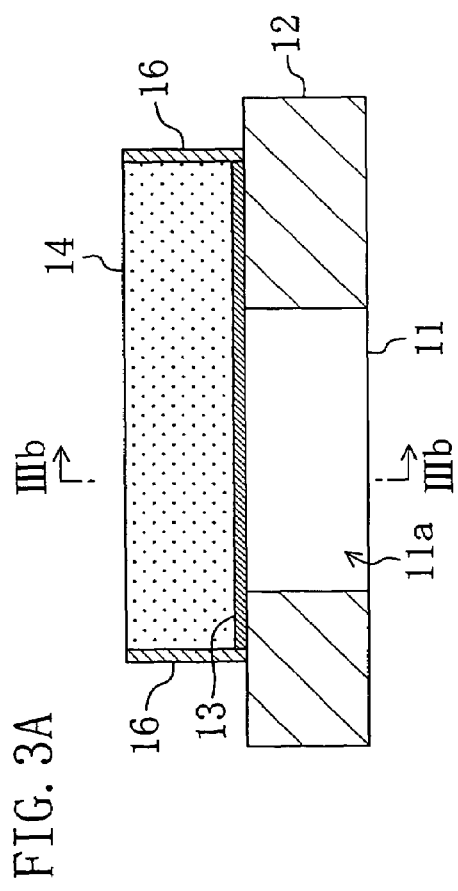

Then, as illustrated in FIGS. 3A and 3B, the TEOS film 16A is etched by etch back using an etching gas containing fluorocarbon as a main component, thereby forming an offset sidewall 16 out of the TEOS film 16A on each side of the gate electrode film 14. Using the gate electrode film 14 and the offset sidewall 16 as a mask, ions of, for example, arsenic (As) are implanted in the active region 11a under the conditions that the acceleration energy is 3 keV, the dose is $1.5 \times 10^{15}/cm^2$ and the tilt angle is 0°, thereby forming an n-type extension region 18 below the side of the offset sidewall 16 in the active region 11a. Thereafter, ions of, for example, boron (B) are implanted in the active region 11a by four rotation injection under the conditions that the acceleration energy is 10 keV, the dose is $8.0 \times 10^{12}/cm^2$ and the tile angle of 25°, thereby forming a p-type pocket region 19 under the n-type extension region 18 and below the offset sidewall 16 in the active region 11a. The "four rotation injection" refers to an ion implantation process in which the semiconductor substrate 11 is rotated approximately 90° at each time within the principal surface and ion implantation described above is performed once at every approximately −90° rotation.

Figure 3C:
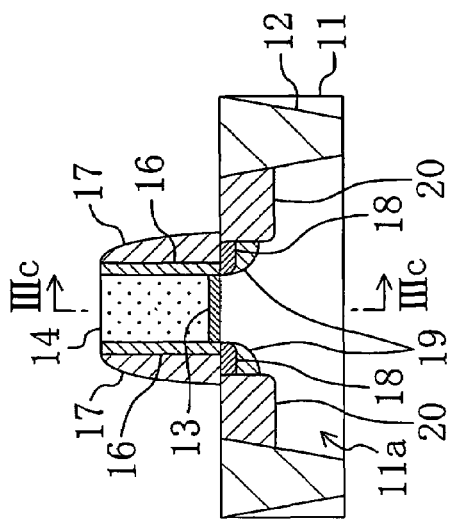
Figure 3D:
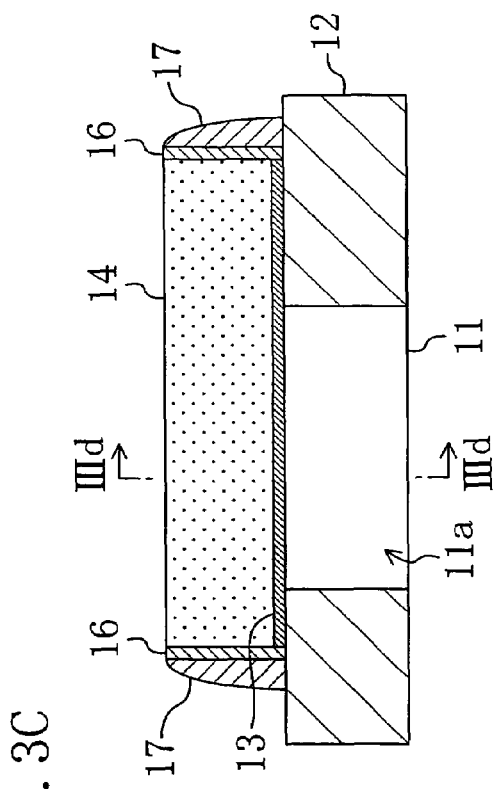

Thereafter, as illustrated in FIGS. 3C and 3D, a silicon nitride film is deposited by CVD over the entire surface of the semiconductor substrate 11 to cover the gate electrode film 14 and the offset sidewall 16. Subsequently, etch back is performed on the silicon nitride film using an etching gas containing fluorocarbon as a main component, thereby forming a sidewall 17 out of the silicon nitride film at the side of the gate electrode film 14 with the offset sidewall 16 interposed therebetween. Using the gate electrode film 14, the offset sidewall 16 and the sidewall 17 as a mask, ions of, for example, arsenic (As) are implanted in the active region 11a under the conditions that the acceleration energy is 20 keV, the dose is $4.0 \times 10^{15}/cm^2$ and the tilt angle is 0°. Subsequently, ions of, for example, phosphorus (P) are implanted under the conditions that the acceleration energy is 10 keV, the dose is $1.0 \times 10^{15}/cm^2$ and the tilt angle is 7°, thereby forming an n-type source/drain region 20 below the side of the sidewall 17 in the active region 11a. The n-type source/drain region 20 has an interface deeper than that of the p-type pocket region 19 and is connected to the n-type extension region 18.

Figure 4A:
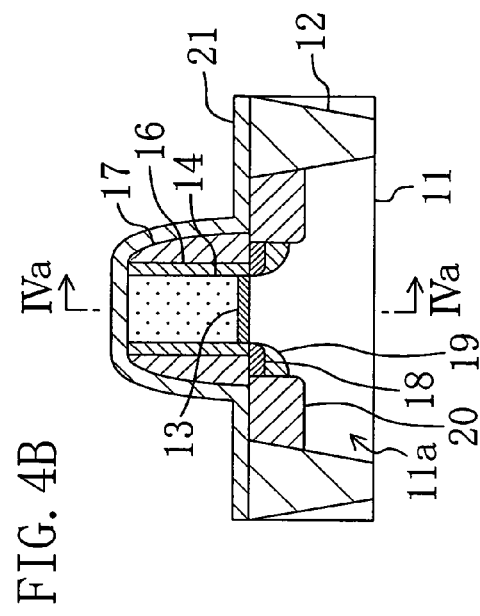
FIGS. 4A through 4D illustrate cross-sectional structures in respective process steps of the method for fabricating a semiconductor device according to the first embodiment in the order of fabrication.
Figure 4B:
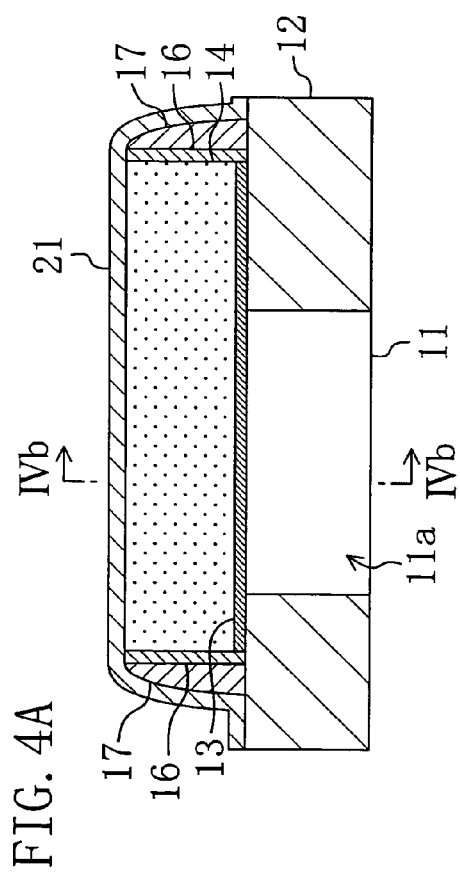

Subsequently, as illustrated in FIGS. 4A and 4B, a protective film 21 made of non-doped silicate glass (NSG) and protecting the gate electrode film 14 is deposited by CVD over the entire surface of the semiconductor substrate 11 to cover the gate electrode film 14 provided with the offset sidewall 16 and the sidewall 17 at its side.

Figure 4C:
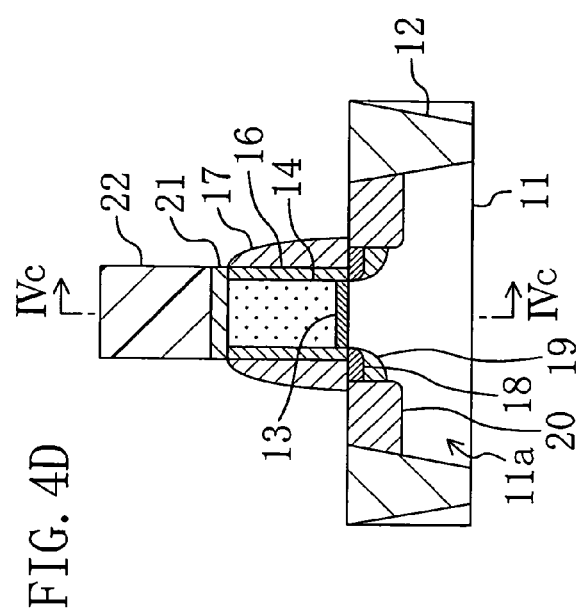
Figure 4D:
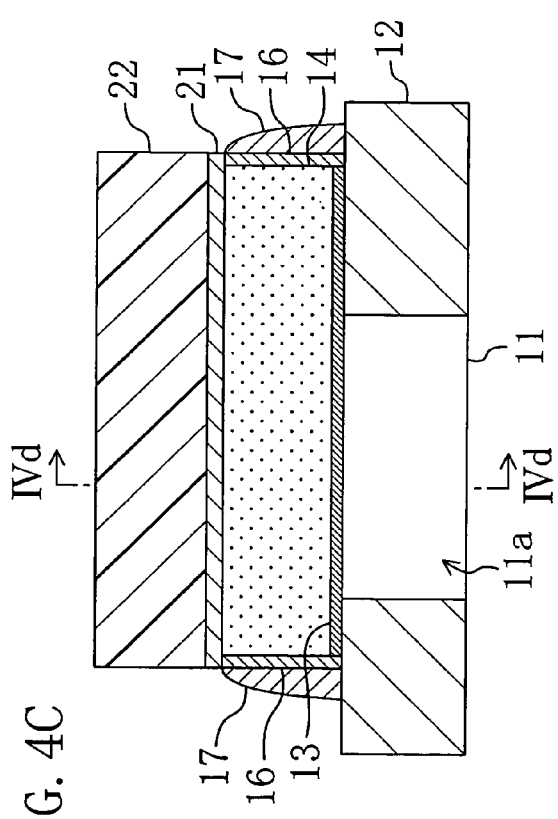

Then, as illustrated in FIGS. 4C and 4D, a resist pattern 22 masking the upper surface of the gate electrode film 14 is formed on the protective film 21 by lithography. Using the resist pattern 22 as a mask, the protective film 21 is removed by etching, thereby exposing the surface of the n-type source/drain region 20.

Figure 5A:
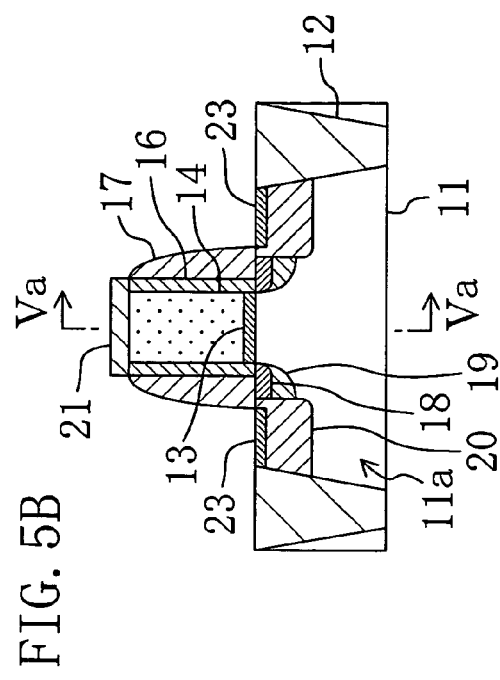
FIGS. 5A through 5D illustrate cross-sectional structures in respective process steps of the method for fabricating a semiconductor device according to the first embodiment in the order of fabrication.
Figure 5B:
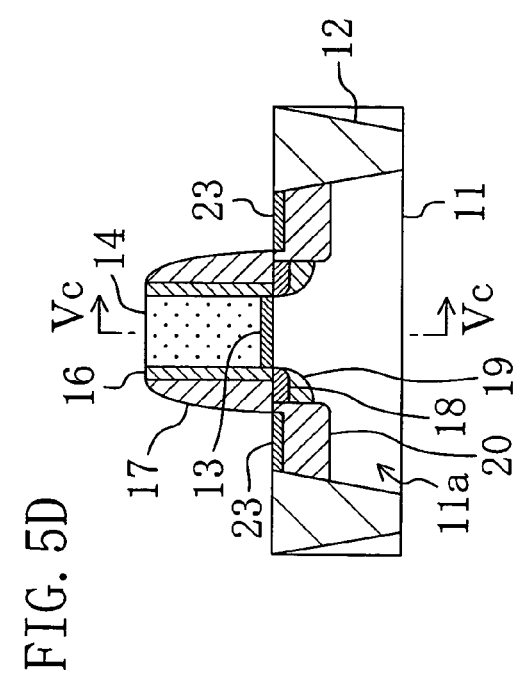

Thereafter, as illustrated in FIGS. 5A and 5B, after the resist pattern 22 is removed, a first metal film made of nickel (Ni) is deposited by sputtering to a thickness of 11 nm over the semiconductor substrate 11 from which the n-type source/drain region 20 is exposed. Then, heat treatment is performed in a nitrogen atmosphere at about 350° C., for example, thereby forming a metal silicide layer 23 made of nickel silicide in an upper portion of the n-type source/drain region 20. At this time, the gate electrode film 14 made of polysilicon is masked with the protective film 21, and thus is not silicided.

Figure 5C:
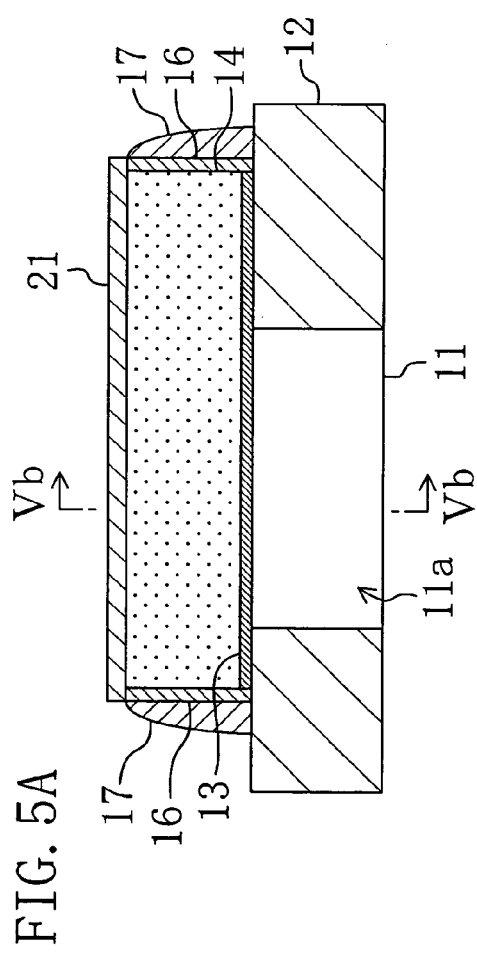
Figure 5D:
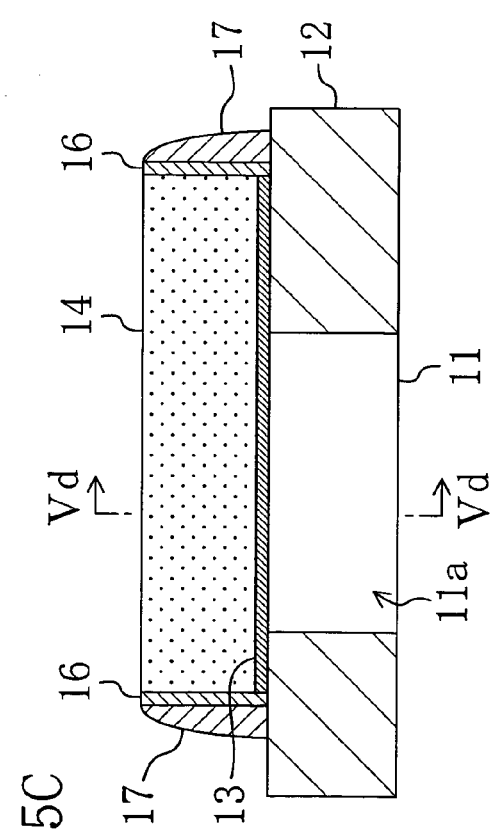

Subsequently, as illustrated in FIGS. 5C and 5D, the protective film 21 of NSG on the gate electrode film 14 is selectively removed by etching.

Figure 6A:
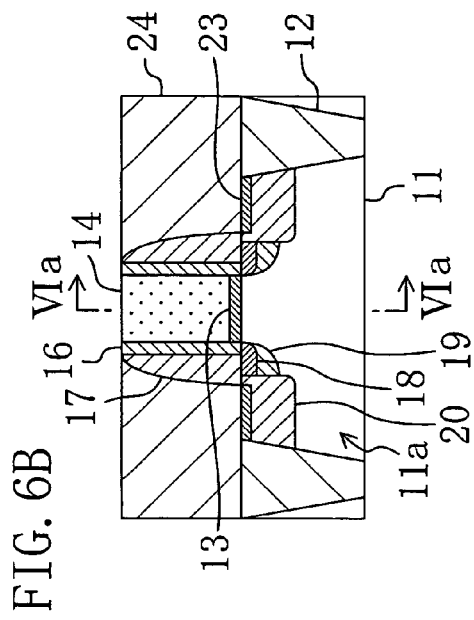
FIGS. 6A through 6D illustrate cross-sectional structures in respective process steps of the method for fabricating a semiconductor device according to the first embodiment in the order of fabrication.
Figure 6B:
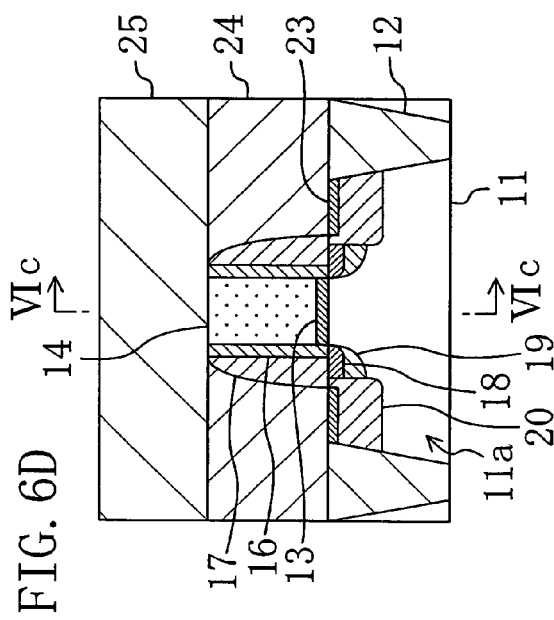

Then, as illustrated in FIGS. 6A and 6B, an interlayer insulating film 24 made of undoped silicate glass (USG), which is undoped silicon oxide, is deposited by plasma CVD over the entire surface of the semiconductor substrate 11 including the gate electrode film 14. Subsequently, the interlayer insulating film 24 is planarized by CMP until the upper surface of the gate electrode film 14 is exposed.

Figure 6C:
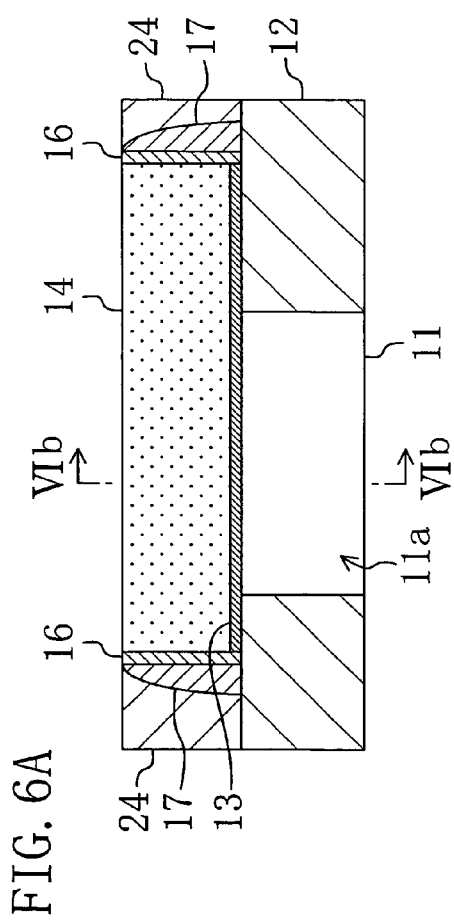
Figure 6D:
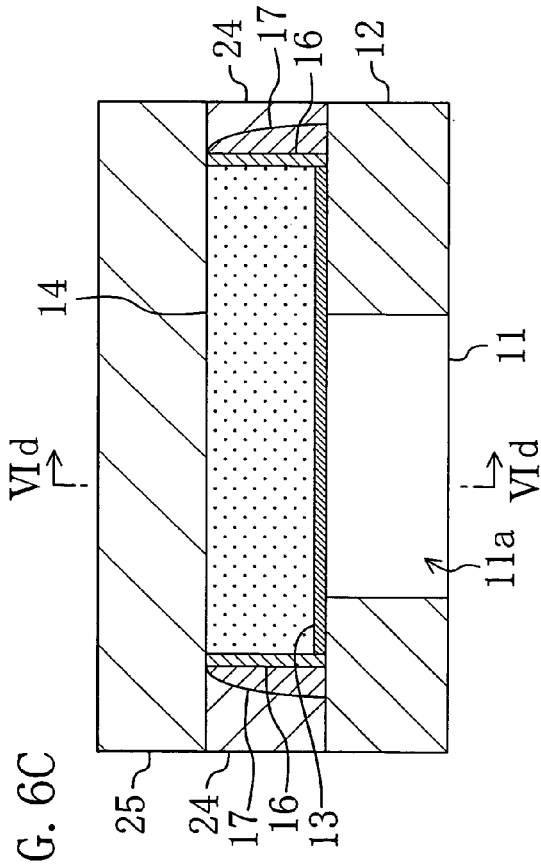

Thereafter, as illustrated in FIGS. 6C and 6D, a second metal film 25 made of nickel is deposited by sputtering to a thickness of 95 nm over the interlayer insulating film 24 from which the gate electrode film 14 is exposed.

Figure 7A:
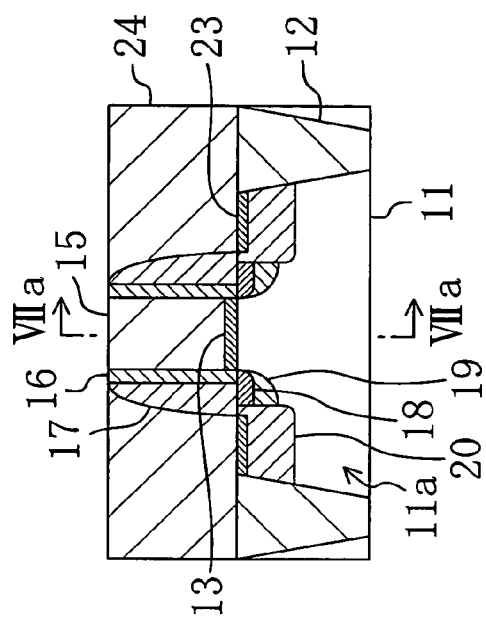
FIGS. 7A and 7B illustrate cross-sectional structures in respective process steps of the method for fabricating a semiconductor device according to the first embodiment.
Figure 7B:
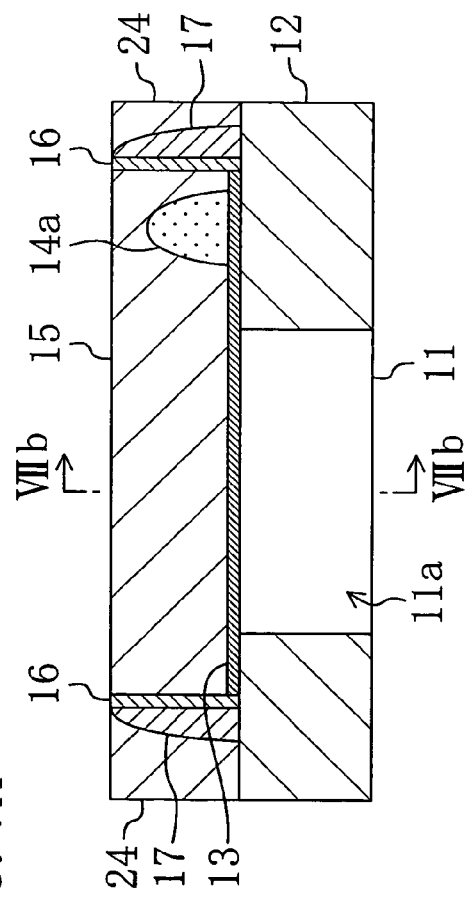

Then, as illustrated in FIGS. 7A and 7B, the second metal film 25 is subjected to heat treatment in a nitrogen atmosphere at about 520° C., for example, thereby siliciding the gate electrode film 14. In this manner, a gate electrode 15 formed by fully siliciding a portion of the gate electrode film 14 located above the active region 11a and made of polysilicon is obtained. At this time, as illustrated in FIGS. 1A and 1B, the width of the contact region 15a located above the isolation region 12 is larger than the width of the portion of the gate electrode 15 located above the active region 11a, so that nickel (Ni) is insufficiently supplied. Accordingly, island polysilicon 14a is formed in a self-aligned manner in the contact region 15a of the gate electrode 15 which is fully silicided above the active region 11a.

As described above, in this embodiment, the island polysilicon 14a is formed inside the contact region 15a of the gate electrode 15 located above the isolation region 12, so that depletion occurs in the gate electrode 15. This depletion reduces the gate electrode capacitance, thus increasing the operation speed of a MIS transistor.

In this embodiment, the thickness (i.e., 95 nm) of the second metal film 25 made of nickel is smaller than the thickness (i.e., 100 nm) of the gate electrode film 14 made of polysilicon. In this case, nickel (Ni) is insufficient when supplied only from a portion of the second metal film 25 located on the gate electrode film 14. Therefore, to fully silicide the gate electrode film 14, it is necessary to also supply nickel from a portion of the second metal film 25 located on the interlayer insulating film 24. In a portion of the gate electrode film 14 having a small patterning width above the active region 11a, the distance from the middle of gate electrode film 14 on the gate insulating film 13 to the portion of the second metal film 25 formed on the interlayer insulating film 24 is short, so that nickel (Ni) is sufficiently supplied from the portion of the second metal film 25 formed on the interlayer insulating film 24 and full silicidation is achieved. On the other hand, in a portion of the gate electrode film 14 to be the contact region 15a having a wide patterning width above the isolation region 12, the distance from the center of the contact region 15a in the gate electrode film 14 located above the isolation region 12 to the portion of the second metal film 25 formed on the interlayer insulating film 24 is long, so that nickel (Ni) is insufficiently supplied from the portion of the second metal film 25 formed on the interlayer insulating film 24. Accordingly, the island polysilicon 14a remains in a lower portion of the center of the contact region 15a. Therefore, the thickness of the second metal film 25 for forming the island polysilicon 14a in the contact region 15a may be equal to or smaller than the thickness of the gate electrode film 14 and is preferably in the range from 60% to 100%, both inclusive. The second metal film 25 and the gate electrode film 14 may have the same thickness. In such a case, the entire portion of the second metal film 25 on the gate electrode film 14 does not contribute to silicidation, so that a structure as shown in FIGS. 1A and 1B is obtained.

The first metal film and the second metal film 25 for silicidation are not necessarily made of nickel, and may be made of cobalt (Co) or tungsten (W).

Embodiment 2

Hereinafter, a second embodiment of the present invention will be described with reference to the drawings.

Figure 8A:
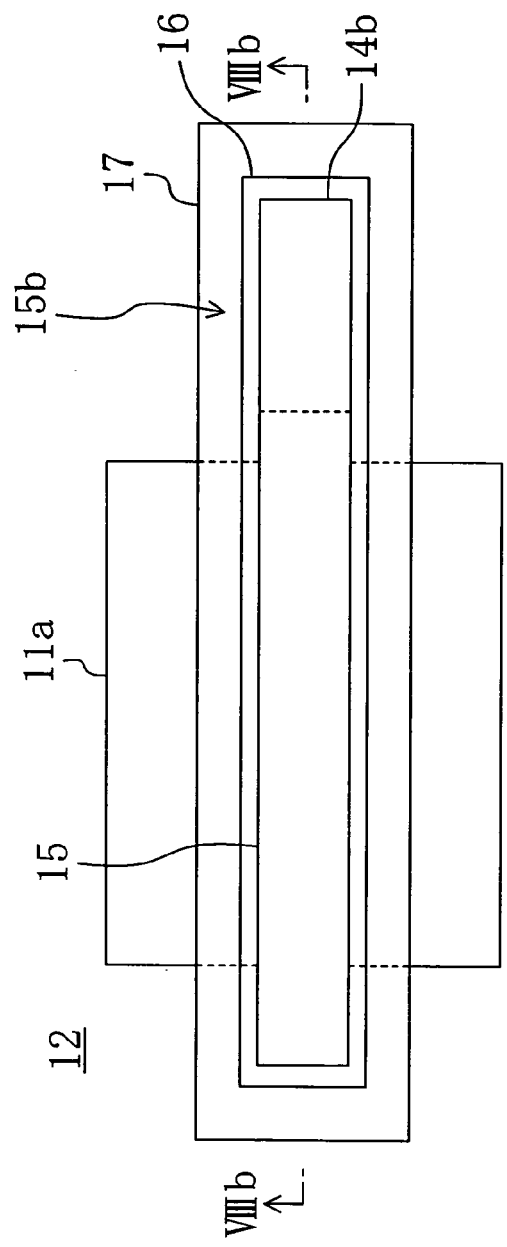
FIGS. 8A and 8B illustrate a semiconductor device according to a second embodiment of the present invention.
Figure 8B:
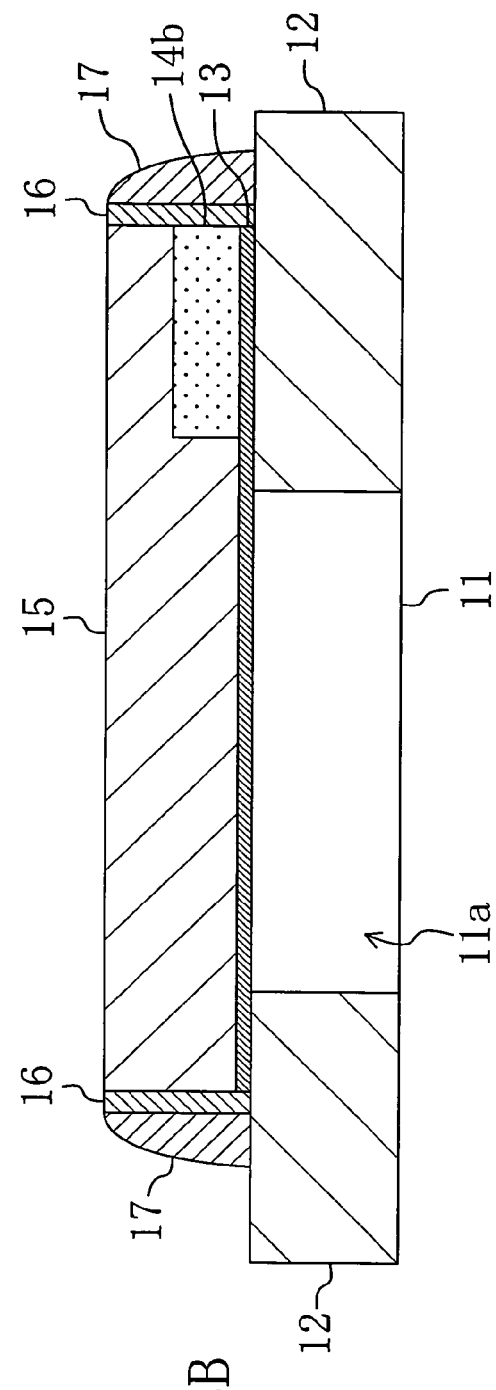

FIGS. 8A and 8B illustrate a semiconductor device according to the second embodiment. FIG. 8A is a plan view and FIG. 8B is a cross-sectional view taken along the line VIIIb-VIIIb in FIG. 8A. As illustrated in FIGS. 8A and 8B, an isolation region 12 of shallow trench isolation (STI) and an active region 11a surrounded by the isolation region 12 are formed in an upper portion of a semiconductor substrate 11 made of, for example, silicon (Si).

As illustrated in FIG. 8B, a silicided gate electrode 15 is formed over the principal surface of the semiconductor substrate 11 across the boundary between the active region 11a and the isolation region 12 with a gate insulating film 13 of a high-κ film interposed therebetween. The high-κ film may be made of hafnium oxide ($HfO_2$), hafnium silicate (HfSiO) or HfSiON, for example.

An end of the gate electrode 15 located above the isolation region 12 is equal to, in the gate length direction, that of the other portion of the gate electrode 15 located above the active region 11a and serves as a contact region 15b, for example.

As illustrated in FIGS. 8A and 8B, an offset sidewall 16 made of silicon dioxide ($SiO_2$) and a sidewall 17 made of silicon nitride ($Si_3N_4$) are stacked in this order on the side of the gate electrode 15.

This embodiment is characterized in that the entire portion of the gate electrode 15 located above the active region 11a is silicided, i.e., has a FUSI structure, and the island polysilicon 14b remains in a lower portion the contact region 15b located above the isolation region 12. In this manner, the island polysilicon 14b remains on one end of the gate electrode 15 located above the isolation region 12, whereas the portion of the gate electrode 15 located above the active region 11a is fully silicided. Accordingly, depletion occurs in the gate electrode 15, thus reducing the gate electrode capacitance.

Hereinafter, a method for fabricating a semiconductor device with the foregoing configuration will be described with reference to the drawings.

FIGS. 9A through 9D to FIGS. 13A and 13B illustrate cross-sectional structures in respective process steps of a method for fabricating a semiconductor device according to the second embodiment in the order of fabrication. FIGS. 9A, 9C, 10A, 10C, 11A, 11C, 12A, 12C and 13A illustrate cross-sectional structures in the gate width direction. FIGS. 9B, 9D, 10B, 10D, 11B, 11D, 12B, 12D and 13B illustrate cross-sectional structures in the gate length direction.

First, as illustrated in FIGS. 9A and 9B, an isolation region 12 of STI is selectively formed in an upper portion of a semiconductor substrate 11, thereby forming an active region 11a surrounded by the isolation region 12. Thereafter, a gate insulating film 13 made of hafnium oxide and having a thickness of 3 nm is formed on the entire principal surface of the semiconductor substrate by, for example, chemical vapor deposition (CVD). Subsequently, a semiconductor film 14A of polysilicon with a thickness of 100 nm is formed on the gate insulating film 13. The semiconductor film 14A may be made of amorphous silicon, instead of polysilicon. Thereafter, an insulating film 26A made of silicon oxide and having a thickness of 50 nm is formed on the semiconductor film 14A.

Next, as illustrated in FIGS. 9C and 9D, the insulating film 26A and the semiconductor film 14A are patterned by lithography and dry etching, thereby forming a protective film 26 and a gate electrode film 14. The gate electrode film 14 have a shape similar to that of the gate electrode 15 illustrated in FIG. 8A and extends in the gate width direction in such a manner that the middle of the gate electrode film 14 is located above the active region 11a, both ends thereof are located above the isolation region 12 and one of the ends serves as a contact region. Subsequently, a TEOS (tetra-ethyl-ortho-silicate) film 16A with a thickness of 14 nm is formed over the entire surface of the semiconductor substrate 11 including the gate electrode film 14.

Figure 10A:
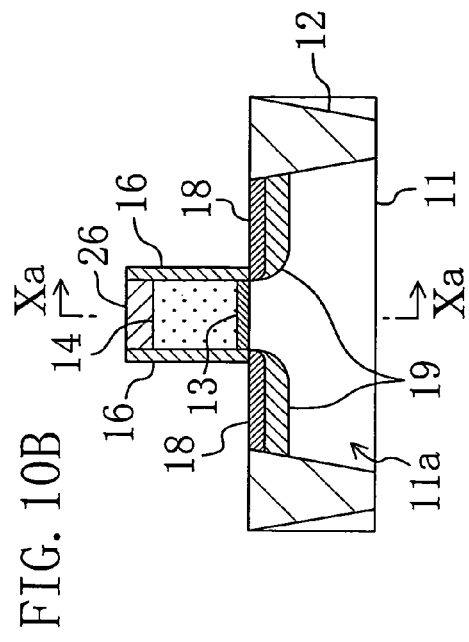
FIGS. 10A through 10D illustrate cross-sectional structures in respective process steps of the method for fabricating a semiconductor device according to the second embodiment in the order of fabrication.
Figure 10B:
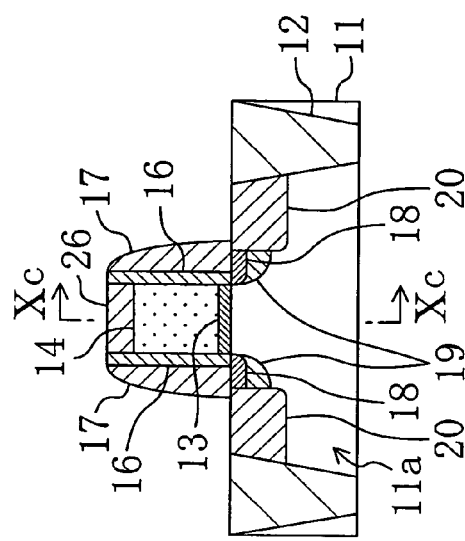

Then, as illustrated in FIGS. 10A and 10B, the TEOS film 16A is etched by etch back using an etching gas containing fluorocarbon as a main component, thereby forming an offset sidewall 16 out of the TEOS film 16A on each side of the gate electrode film 14. Using the gate electrode film 14 and the offset sidewall 16 as a mask, ions of, for example, arsenic (As) are implanted in the active region 11a under the conditions that the acceleration energy is 3 keV, the dose is $1.5 \times 10^{15}/cm^2$ and the tilt angle is 0°, thereby forming an n-type extension region 18 below the side of the offset sidewall 16 in the active region 11a. Thereafter, ions of, for example, boron (B) are implanted in the active region 11a by four rotation injection under the conditions that the acceleration energy is 10 keV, the dose is $8.0 \times 10^{12}/cm^2$ and the tile angle is 25°, thereby forming a p-type pocket region 19 under the n-type extension region 18 in the active region 11a. The "four rotation injection" refers to an ion implantation process in which the semiconductor substrate 11 is rotated approximately 90° at each time within the principal surface and ion implantation described above is performed once at every approximately −90° rotation.

Figure 10C:
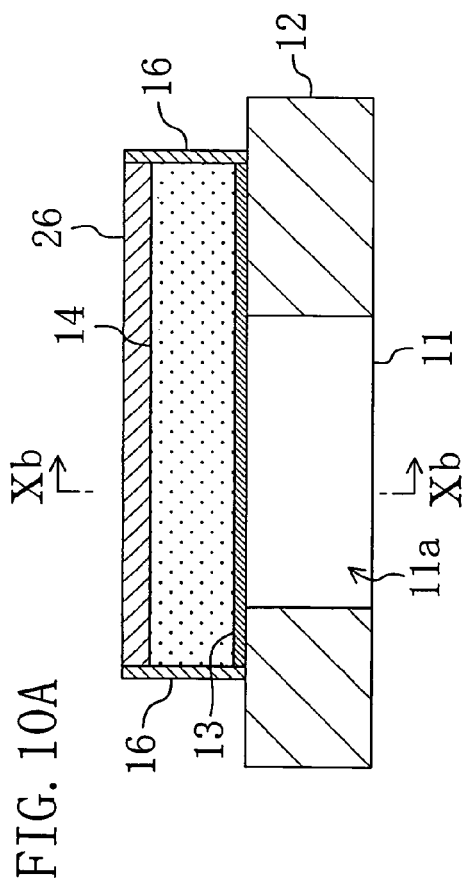
Figure 10D:
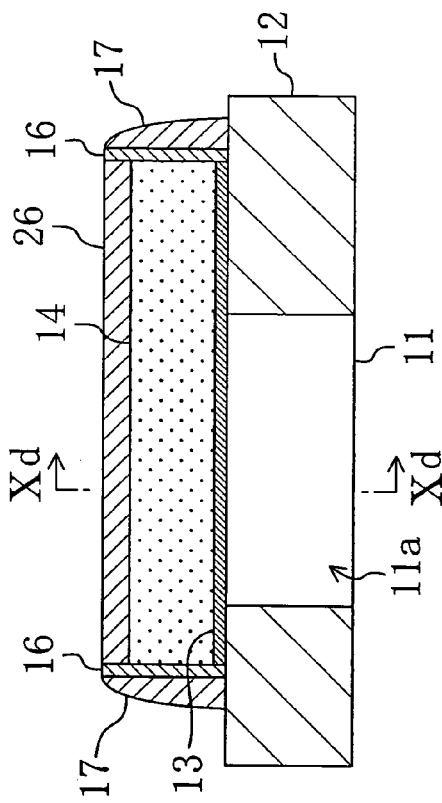

Thereafter, as illustrated in FIGS. 10C and 10D, a silicon nitride film is deposited by CVD over the entire surface of the semiconductor substrate 11 to cover the gate electrode film 14 and the offset sidewall 16. Subsequently, etch back is performed on the silicon nitride film using an etching gas containing fluorocarbon as a main component, thereby forming a sidewall 17 out of the silicon nitride film at the side of the gate electrode film 14 with the offset sidewall 16 interposed therebetween. Using the gate electrode film 14, the offset sidewall 16 and the sidewall 17 as a mask, ions of, for example, arsenic (As) are implanted in the active region 11a under the conditions that the acceleration energy is 20 keV, the dose is $4.0 \times 10^{15}/cm^2$ and the tilt angle is 0°. Subsequently, ions of, for example, phosphorus (P) are implanted under the conditions that the acceleration energy is 10 keV, the dose is $1.0 \times 10^{15}/cm^2$ and the tilt angle is 7°, thereby forming an n-type source/drain region 20 below the side of the sidewall 17 in the active region 11a. The n-type source/drain region 20 has an interface deeper than that of the p-type pocket region 19 and is connected to the n-type extension region 18.

Then, as illustrated in FIGS. 11A and 11B, a first metal film 27 made of nickel (Ni) is deposited by sputtering to a thickness of 11 nm over the semiconductor substrate 11 from which the n-type source/drain region 20 is exposed.

Thereafter, as illustrated in FIGS. 11C and 11D, heat treatment is performed in a nitrogen atmosphere at about 350° C., for example, thereby forming a metal silicide layer 23 made of nickel silicide in an upper portion of the n-type source/drain region 20. At this time, the gate electrode film 14 made of polysilicon is masked with the protective film 26, and thus is not silicided. Then, the remaining unreacted first metal film 27 is selectively removed.

Figure 12A:
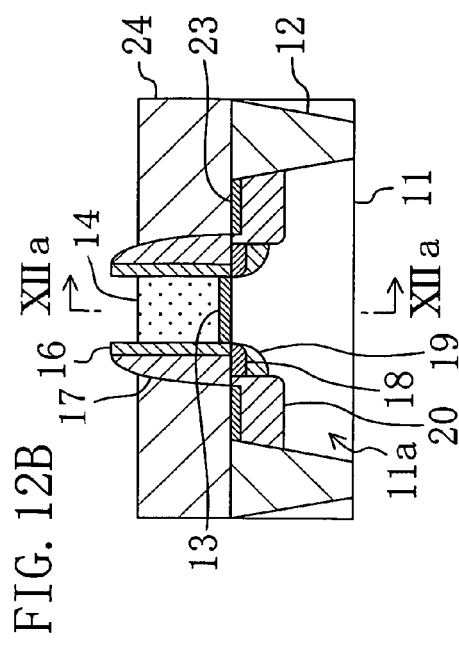
FIGS. 12A through 12D illustrate cross-sectional structures in respective process steps of the method for fabricating a semiconductor device according to the second embodiment in the order of fabrication.
Figure 12B:
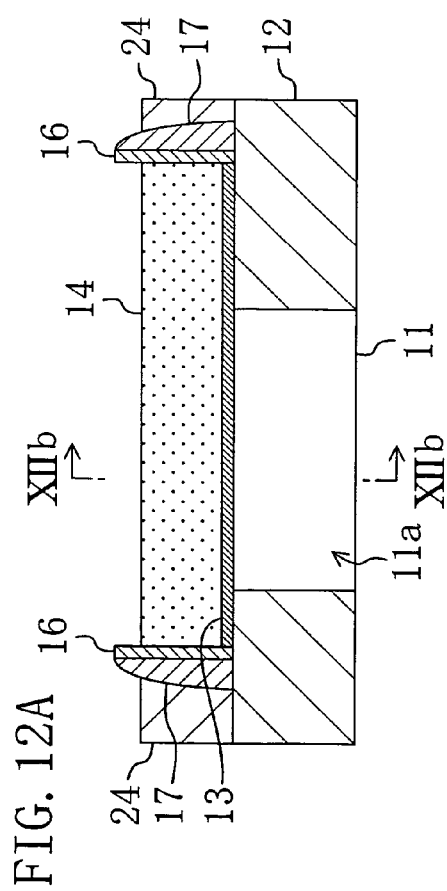

Then, as illustrated in FIGS. 12A and 12B, an interlayer insulating film 24 made of undoped silicate glass (USG), which is undoped silicon oxide, is deposited by plasma CVD over the entire surface of the semiconductor substrate 11 including the gate electrode film 14. Subsequently, the interlayer insulating film 24 is planarized by CMP until the protective film 26 is exposed. Thereafter, the protective film 26 and the interlayer insulating film 24 are etched using dry etching or wet etching under conditions for selectively etching silicon oxide with respect to silicon nitride and polysilicon. At this time, the interlayer insulating film 24 is not necessarily etched, and only the protective film 26 may be selectively etched. To selectively etch the silicon oxide film, in the case of dry etching, reactive ion etching in which $C_5F_8$, $O_2$ and Ar are supplied at flow rates of 15 ml/min (standard condition), 18 ml/min (standard condition) and 950 ml/min (standard condition), respectively, the pressure is 6.7 Pa, the RF outputs (T/B) are 1800 W/1500 W, and the substrate temperature is 0° C. may be adopted.

Figure 12C:
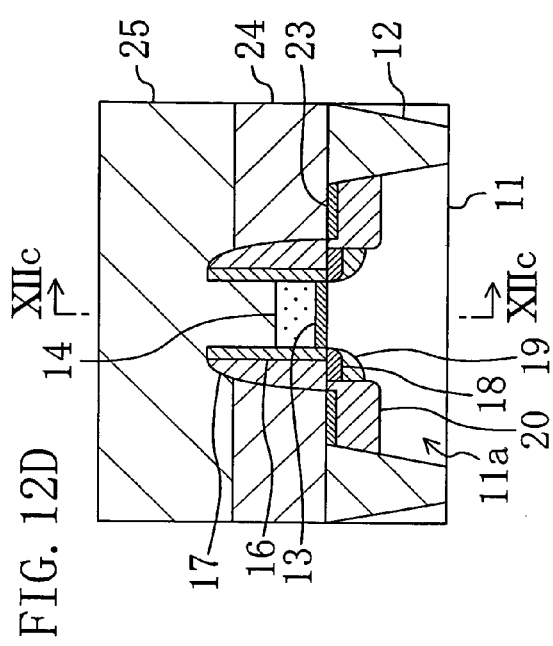
Figure 12D:
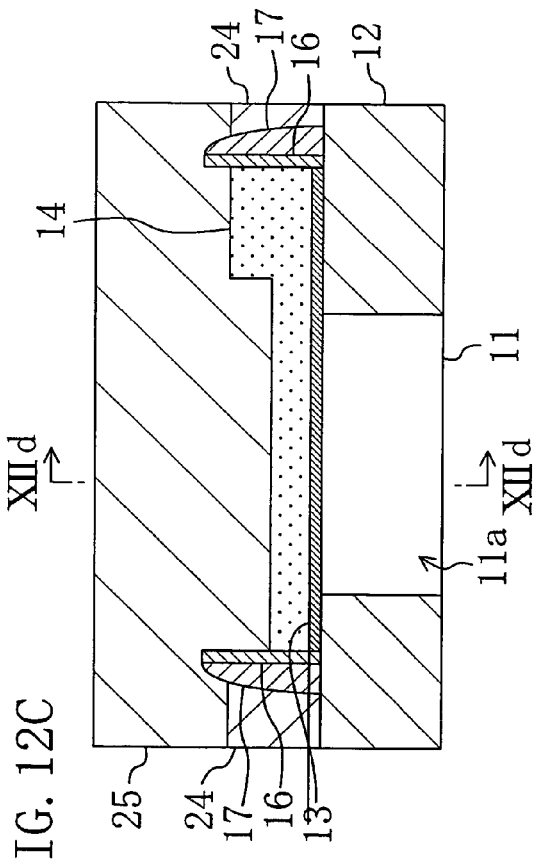

Thereafter, as illustrated in FIGS. 12C and 12D, a resist (not shown) covering a contact region of the gate electrode film 14 located above the isolation region 12 is formed. Subsequently, the gate electrode film 14 is etched by dry etching except for a region thereof covered with the resist so that the resultant thickness of the gate electrode film 14 is 40 nm. In this manner, the thickness of the contact region of the gate electrode film 14 is 100 nm, whereas the thickness of a portion of the gate electrode film 14 located above the active region 11a is 40 nm. Thereafter, a second metal film 25 made of nickel is deposited by sputtering to a thickness of 50 nm over the interlayer insulating film 24 from which the gate electrode film 14 is exposed.

Figure 13A:
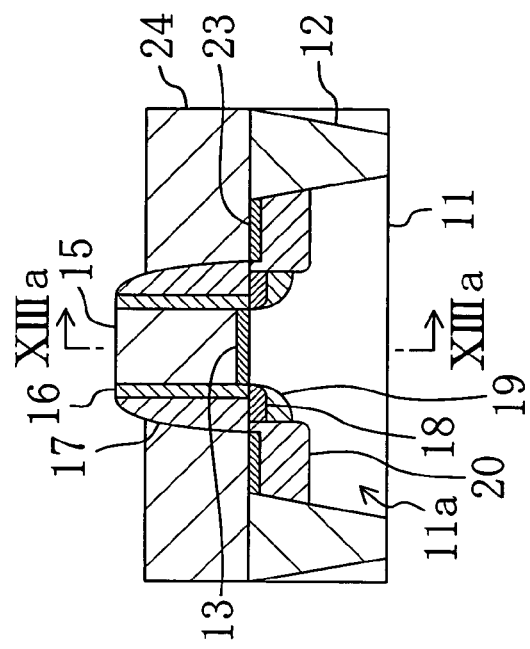
FIGS. 13A and 13B illustrate cross-sectional structures in respective process steps of the method for fabricating a semiconductor device according to the second embodiment.
Figure 13B:
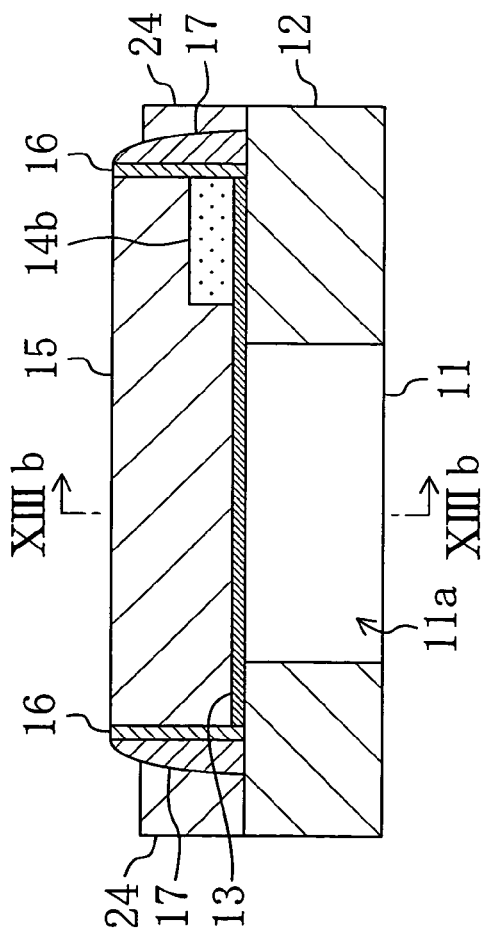

Then, as illustrated in FIGS. 13A and 13B, the second metal film 25 is subjected to heat treatment in a nitrogen atmosphere at about 520° C., for example, thereby siliciding the gate electrode film 14. In this manner, a gate electrode 15 formed by fully siliciding a portion of the gate electrode film 14 located above the active region 11a and made of polysilicon is obtained. At this time, the thickness of the contact region 15b in a portion of the gate electrode film 14 located above the isolation region 12 is larger than the thickness of a portion of the gate electrode film 14 located above the active region 11a, so that a portion of polysilicon included in the contact region 15b is not silicided and remains as island polysilicon 14b.

The first metal film 27 and the second metal film 25 for silicidation are not necessarily made of nickel, and may be made of cobalt (Co) or tungsten (W).

Modified Example of Embodiment 2

Figure 14A:
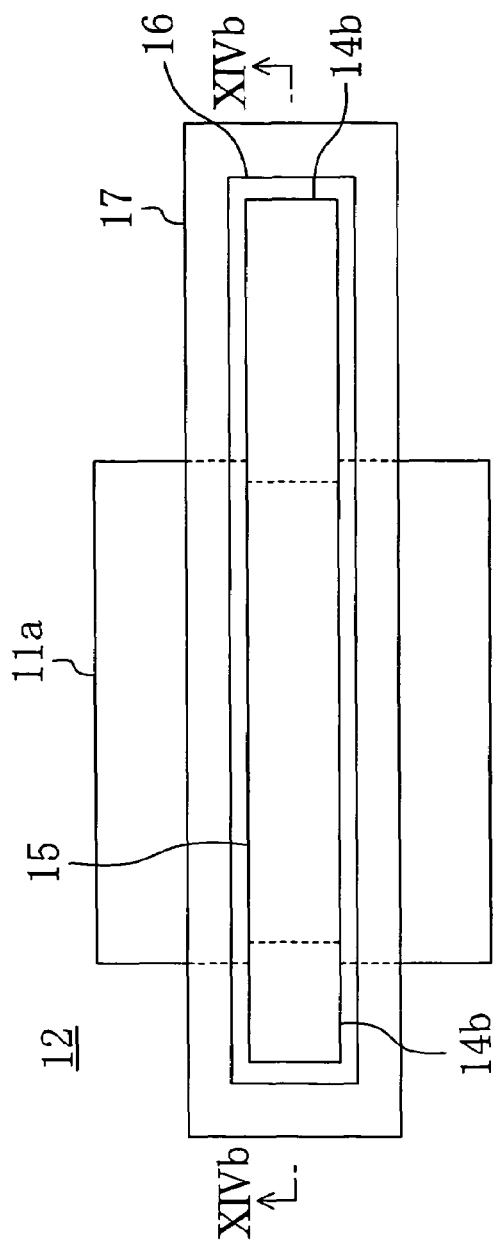
FIGS. 14A and 14B illustrate a semiconductor device according to a modified example of the second embodiment.
Figure 14B:
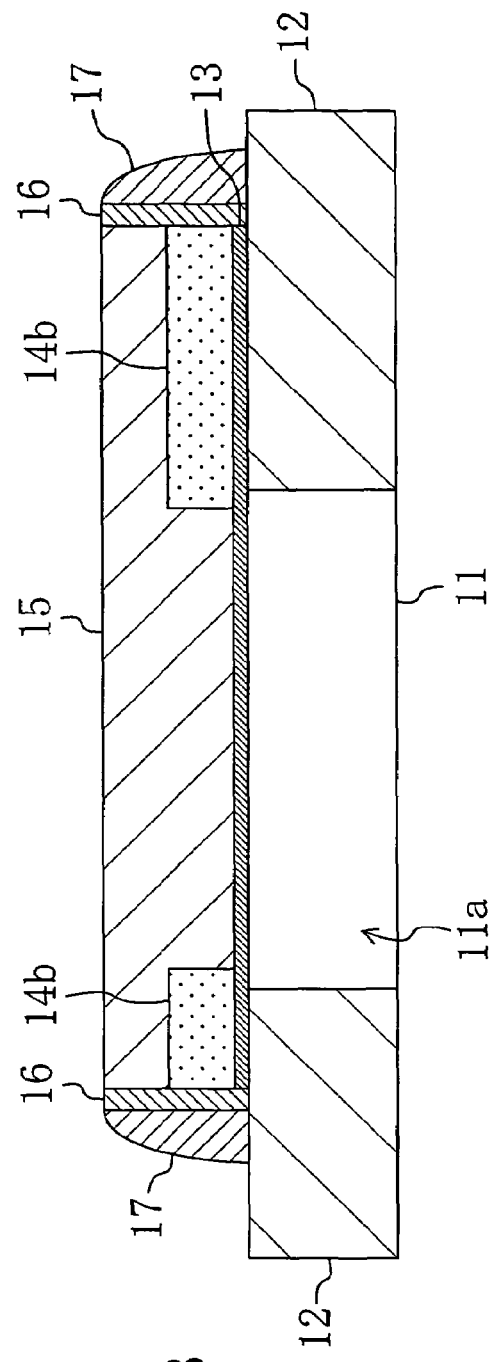
Figure 16A:
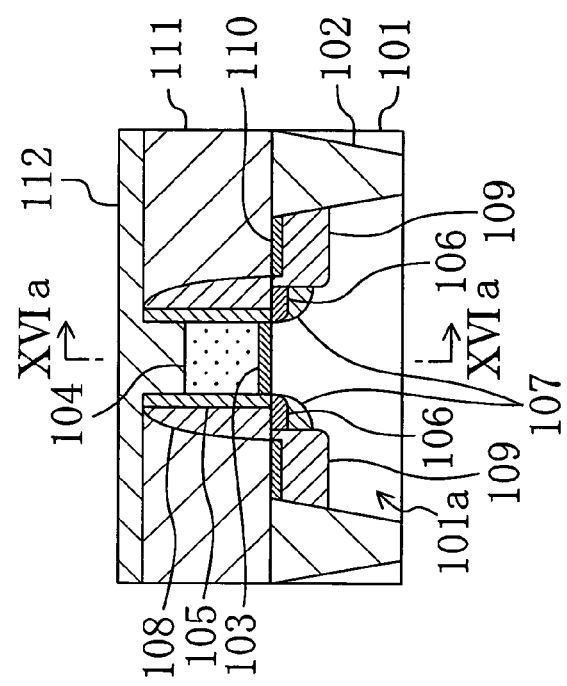
FIGS. 16A and 16B illustrate a full silicidation process in a method for fabricating a conventional MIS transistor.
Figure 16B:
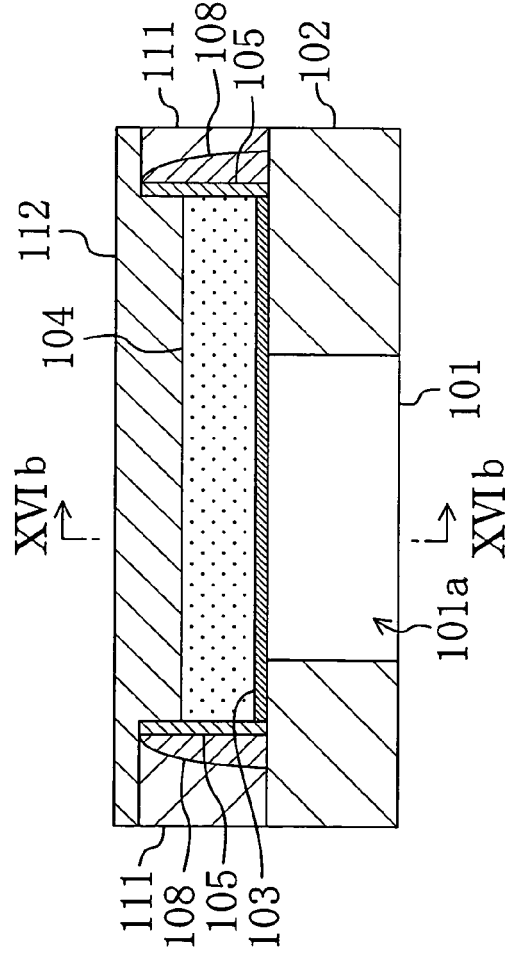

FIGS. 14A and 14B illustrate a semiconductor device according to a modified example of the second embodiment. FIG. 14A is a plan view and FIG. 14B is a cross-sectional view taken along the line XIVb-XIVb in FIG. 14A.

As illustrated in FIGS. 14A and 14B, in a modified example of the second embodiment, island polysilicon 14b is formed above an isolation regions 12 located at each end of an active region 11a, and the island polysilicon 14b is formed across the end of the active region 11a.

Embodiment 3

Hereinafter, a third embodiment of the present invention will be described with reference to the drawings.

In the third embodiment, another example of the method for fabricating a semiconductor device according to the second embodiment is described. In this embodiment, only aspects different from those of the second embodiment are described.

FIGS. 15A through 15D illustrate cross-sectional structures of a main portion in respective process steps of a method for fabricating a semiconductor device according to the third embodiment. FIGS. 15A and 15C are cross-sectional views in the gate width direction. FIGS. 15B and 15D are cross-sectional views in the gate length direction.

First, as illustrated in FIGS. 15A and 15B, the same structure as illustrated in FIGS. 12A and 12B is obtained by a method similar to that shown in FIGS. 9A and 9B to FIGS. 12A and 12B.

Next, as illustrated in FIGS. 15C and 15D, a second metal film 25 made of nickel is deposited by sputtering to a thickness of 95 nm over an interlayer insulating film 24 from which a gate electrode film 14 is exposed. Thereafter, a portion of the second metal film 25 located above a contact region of the gate electrode film 14 is selectively etched using, for example, a chlorine gas so that the thickness of this portion of the second metal film 25 is 40 nm. In this manner, a portion of the second metal film 25 located above an active region 11a has a thickness of 95 nm, whereas the portion of the second metal film 25 located above the contact region of the gate electrode film 14 is 40 nm.

Thereafter, as illustrated in FIGS. 13A and 13B, the second metal film 25 in which the thickness of a portion above the contact region is reduced is subjected to heat treatment in a nitrogen atmosphere at about 520° C., for example, thereby siliciding the gate electrode film 14. In this manner, a gate electrode 15 formed by fully siliciding a portion of the gate electrode film 14 located above the active region 11a and made of polysilicon is obtained. At this time, the thickness of the portion of the second metal film 25 above the contact region for a gate electrode is smaller than the thickness of the portion of the second metal film 25 located above the active region 11a. Accordingly, a portion of polysilicon in the contact region of the gate electrode film 14 is not silicided and remains as island polysilicon 14b.

In the second and third embodiments and the modified example of the second embodiment, an end (e.g., the contact region 15b) of the gate electrode 15 located above the isolation region 12 and another portion of the gate electrode 15 located above the active region 11a have the same width in the gate length direction. Alternatively, as in the first embodiment, the length in the gate length direction of the end (e.g., the contact region 15b) located above the isolation region 12 may be larger than the other portion above the active region 11a. In this case, in the process step shown in FIGS. 9C and 9D, the length in the gate length direction of a portion to be a contact region formed above the isolation region 12 is larger than that of another portion formed above the active region 11a.

As described above, in a semiconductor device and a method for fabricating the device according to the present invention, silicidation is performed with a silicon region left in a portion of a gate electrode located above an isolation region and the gate electrode is fully silicided above an active region. Accordingly, the capacitance of the FUSI gate electrode is reduced. Therefore, the present invention is useful for semiconductor devices including gate electrodes to be fully silicided and methods for fabricating such devices.

What is claimed is:
1. A semiconductor device, comprising:
an isolation region formed in a semiconductor substrate;
an active region surrounded by the isolation region in the semiconductor substrate;
a gate insulating film formed on the active region; and
a gate electrode formed across the boundary between the active region and the isolation region adjacent to the active region,
wherein the gate electrode includes a first portion which is located above the active region with the gate insulating film interposed therebetween and is entirely made of a silicide region in a thickness direction and a second portion which is located above the isolation region and is made of a silicon region and the silicide region covering the silicon region, and the silicon region is formed only above the isolation region.

2. The semiconductor device of claim 1, wherein the silicon region is located above the isolation region and is apart from the boundary between the active region and the isolation region.

3. The semiconductor device of claim 1, wherein the silicon region is formed across a portion above the active region.

4. The semiconductor device of claim 1, wherein the length in a gate length direction of the second portion of the gate electrode is larger than that of the first portion of the gate electrode.

5. The semiconductor device of claim 1, wherein the length in a gate length direction of the first portion of the gate electrode is equal to that of the second portion of the gate electrode.

6. The semiconductor device of claim 1, wherein the second portion of the gate electrode is a contact region.

7. The semiconductor device of claim 1, wherein the silicon region is made of one of polysilicon and amorphous silicon.

8. The semiconductor device of claim 1, wherein the silicide region is made of nickel silicide.

9. The semiconductor device of claim 1, wherein the gate insulating film is made of a high-dielectric-constant film.

10. The semiconductor device of claim 1, wherein the gate insulating film is made of a high-K film.

11. The semiconductor device of claim 10, wherein the high-K film is made of hafnium oxide, hafnium silicate or HfSiON.

12. The semiconductor device of claim 1, wherein the silicide region is made of nickel silicide.

13. The semiconductor device of claim 1, wherein
an end portion of the gate electrode formed above the isolation region is wider, in a gate length direction, than the other portion of the gate electrode located above the active region, and
the silicon region is formed only on the end portion of the gate electrode formed above the isolation region.

* * * * *

UNITED STATES PATENT AND TRADEMARK OFFICE
CERTIFICATE OF CORRECTION

PATENT NO. : 7,646,065 B2
APPLICATION NO. : 11/542269
DATED : January 12, 2010
INVENTOR(S) : Kotani et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 330 days.

Signed and Sealed this

Sixteenth Day of November, 2010

David J. Kappos
*Director of the United States Patent and Trademark Office*